United States Patent
Sugimura et al.

(10) Patent No.: US 11,479,863 B2
(45) Date of Patent: Oct. 25, 2022

(54) CHEMICAL SOLUTION AND METHOD FOR TREATING SUBSTRATE

(71) Applicant: FUJIFILM Corporation, Tokyo (JP)

(72) Inventors: Nobuaki Sugimura, Haibara-gun (JP); Tomonori Takahashi, Haibara-gun (JP); Hiroyuki Seki, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 0 days.

(21) Appl. No.: 17/183,449

(22) Filed: Feb. 24, 2021

(65) Prior Publication Data

US 2021/0180192 A1 Jun. 17, 2021

Related U.S. Application Data

(63) Continuation of application No. PCT/JP2019/031696, filed on Aug. 9, 2019.

(30) Foreign Application Priority Data

Sep. 12, 2018 (JP) .............................. JP2018-170838

(51) Int. Cl.
*C23F 1/26* (2006.01)
(52) U.S. Cl.
CPC ...................... *C23F 1/26* (2013.01)
(58) Field of Classification Search
None
See application file for complete search history.

(56) References Cited

U.S. PATENT DOCUMENTS 3,951,547 A * 4/1976 Fujinami ............... C03C 17/245
  355/133
3,960,589 A * 6/1976 Morrison .................. C09C 1/00
  106/425

(Continued)

FOREIGN PATENT DOCUMENTS

JP  2009-231354 A  10/2009
JP  2016-092101 A  5/2016

(Continued)

OTHER PUBLICATIONS

International Search Report dated Sep. 24, 2019, issued by the International Searching Authority in application No. PCT/JP2019/031696.

(Continued)

*Primary Examiner* — Allan W. Olsen
(74) *Attorney, Agent, or Firm* — Sughrue Mion, PLLC

(57) ABSTRACT

The present invention provides a chemical solution having excellent storage stability and excellent defect inhibition performance. The present invention also provides a method for treating a substrate. The chemical solution according to an embodiment of the present invention is a chemical solution used for removing a transition metal-containing substance on a substrate. The chemical solution contains one or more kinds of halogen oxoacids selected from the group consisting of a halogen oxoacid and a salt thereof and one or more kinds of specific anions selected from the group consisting of $SO_4^{2-}$, $NO_3^-$, $PO_4^{3-}$, and $BO_3^{3-}$. In a case where the chemical solution contains one kind of the specific anion, a content of one kind of the specific anion is 5 ppb by mass to 1% by mass with respect to a total mass of the chemical solution. In a case where the chemical solution contains two or more kinds of the specific anions, a content of each of two or more kinds of the specific anions is equal to or lower than 1% by mass with respect to the total mass (Continued)

of the chemical solution, and a content of at least one of two or more kinds of the specific anions is equal to or higher than 5 ppb by mass with respect to the total mass of the chemical solution.

27 Claims, 2 Drawing Sheets

(56) References Cited

U.S. PATENT DOCUMENTS

| | | | |
|---|---|---|---|
| 2004/0134873 A1* | 7/2004 | Yao | H01L 21/3212 216/2 |
| 2009/0192231 A1* | 7/2009 | Lemons | B08B 3/08 514/738 |
| 2009/0200166 A1* | 8/2009 | Nakayama | C07K 1/16 204/451 |
| 2009/0326234 A1* | 12/2009 | Lee | C07D 211/90 546/321 |
| 2010/0155242 A1* | 6/2010 | Nakayama | G01N 27/44747 204/601 |
| 2010/0330202 A1* | 12/2010 | Goda | C01B 11/08 424/661 |
| 2013/0069024 A1* | 3/2013 | Suzuki | G02B 5/208 252/587 |
| 2015/0021513 A1* | 1/2015 | Kim | H01L 21/32139 252/79.4 |
| 2016/0088846 A1* | 3/2016 | Lemons | A23L 3/3463 424/605 |
| 2017/0229308 A1* | 8/2017 | Park | H01L 43/12 |
| 2017/0306501 A1* | 10/2017 | Jeon | C23F 1/18 |
| 2017/0362466 A1* | 12/2017 | Shi | B24B 37/044 |

FOREIGN PATENT DOCUMENTS

| | | | |
|---|---|---|---|
| JP | 2018-032781 A | 3/2018 | |
| KR | 10-2018-0088441 A | 8/2018 | |
| WO | 2016/068182 A1 | 5/2016 | |
| WO | 2017/126554 A1 | 7/2017 | |
| WO | WO-2017126554 A1 * | 7/2017 | ............... C11D 7/32 |

OTHER PUBLICATIONS

Written Opinion dated Sep. 24, 2019, issued by the International Searching Authority in application No. PCT/JP2019/031696.
International Preliminary Report on Patentability dated Mar. 9, 2021, issued by the International Bureau in application No. PCT/JP2019/031696.
Office Action dated Mar. 8, 2022 from the Japanese Patent Office in JP Application No. 2020-546779.
Office Action dated Aug. 11, 2022 in Korean Application No. 10-2021-7007061.

* cited by examiner

US 11,479,863 B2

CHEMICAL SOLUTION AND METHOD FOR TREATING SUBSTRATE

CROSS-REFERENCE TO RELATED APPLICATIONS

This application is a Continuation of PCT International Application No. PCT/JP2019/031696 filed on Aug. 9, 2019, which claims priority under 35 U.S.C. § 119(a) to Japanese Patent Application No. 2018-170838 filed on Sep. 12, 2018. The above application is hereby expressly incorporated by reference, in its entirety, into the present application.

BACKGROUND OF THE INVENTION

1. Field of the Invention

The present invention relates to a chemical solution and a method for treating a substrate.

2. Description of the Related Art

As the miniaturization of semiconductor products progresses, there is an increasing demand for performing a step of removing unnecessary transition metal-containing substances on a substrate in a semiconductor product manufacturing process with high efficiency and high accuracy.

JP2016-092101A describes "method for treating a substrate on which a ruthenium-containing film is formed, including a step of removing ruthenium deposits attached to the outer edge of a surface of the substrate on which the ruthenium-containing film is formed and/or ruthenium deposits attached to a back surface of the substrate by using a remover solution, wherein a content of orthoperiodic acid in the remover solution with respect to a total mass of the remover solution is 0.05% to 8% by mass, and a pH of the remover solution is equal to or lower than 3.5 (Claim 1)".

SUMMARY OF THE INVENTION

In view of manufacturing stability, it is required that a chemical solution has performance which changes little over time (storage stability).

In addition, it is required that the chemical solution further inhibits the occurrence of defects on a substrate treated using the chemical solution in a case where unnecessary transition metal-containing substances on the substrate are removed using the chemical solution (defect inhibition properties). In a case where a defect occurs on a substrate, an electrical defect easily occurs between wirings arranged on the substrate, which leads to a reduction in yield.

The inventors of the present invention examined the chemical solution disclosed in JP2016-092101A. As a result, they have found that the defect inhibition properties of the chemical solution need to be further improved.

An object of the present invention is to provide a chemical solution having excellent storage stability and excellent defect inhibition performance.

Another object of the present invention is to provide a method for treating a substrate.

In order to achieve the above objects, the inventors of the present invention conducted intensive studies. As a result, they have found that the objects can be achieved by the following constitutions.

[1] A chemical solution used for removing a transition metal-containing substance on a substrate, containing: one or more kinds of halogen oxoacids selected from the group consisting of a halogen oxoacid and a salt thereof; and one or more kinds of specific anions selected from the group consisting of $SO_4^{2-}$, $NO_3^-$, $PO_4^{3-}$, and $BO_3^{3-}$, in which in a case where the chemical solution contains one kind of the specific anion, a content of one kind of the specific anion is 5 ppb by mass to 1% by mass with respect to a total mass of the chemical solution, and in a case where the chemical solution contains two or more kinds of the specific anions, a content of each of two or more kinds of the specific anions is equal to or lower than 1% by mass with respect to the total mass of the chemical solution, and a content of at least one of two or more kinds of the specific anions is equal to or higher than 5 ppb by mass with respect to the total mass of the chemical solution.

[2] The chemical solution described in [1], containing at least two kinds of the specific anions, in which a content of each of at least two kinds of the specific anions is 5 ppb by mass to 1% by mass with respect to the total mass of the chemical solution.

[3] The chemical solution described in [2], in which the specific anions contain $SO_4^{2-}$ and $NO_3^-$.

[4] The chemical solution described in [3], in which a mass ratio of a content of $SO_4^{2-}$ to a content of $NO_3^-$ in the chemical solution is higher than $1 \times 10^0$ and equal to or lower than $2 \times 10^6$.

[5] The chemical solution described in any one of [1] to [4], containing at least three kinds of the specific anions, in which a content of each of at least three kinds of the specific anions is 5 ppb by mass to 1% by mass with respect to the total mass of the chemical solution.

[6] The chemical solution described in [5], in which the specific anions contain $SO_4^{2-}$, $NO_3^-$, and one kind of anion selected from the group consisting of $PO_4^{3-}$ and $BO_3^{3-}$.

[7] The chemical solution described in [6], which satisfies at least one of the following requirement A or requirement B.

Requirement A: the specific anions contain $PO_4^{3-}$, and a mass ratio of a content of $SO_4^{2-}$ to a content of $PO_4^{3-}$ in the chemical solution is higher than $1 \times 10^0$ and equal to or lower than $2 \times 10^6$.

Requirement B: the specific anions contain $BO_3^{3-}$, and a mass ratio of a content of $SO_4^{2-}$ to a content of $BO_3^{3-}$ in the chemical solution is higher than $1 \times 10^0$ and equal to or lower than $2 \times 10^6$.

[8] The chemical solution described in any one of [1] to [7], containing $SO_4^{2-}$, $NO_3^-$, $PO_4^{3-}$, and $BO_3^{3-}$, in which a content of each of these anions is 5 ppb by mass to 1% by mass with respect to the total mass of the chemical solution.

[9] The chemical solution described in [8], which satisfies at least one of the following requirement A or requirement B.

Requirement A: the specific anions contain $PO_4^{3-}$, and a mass ratio of a content of $SO_4^{2-}$ to a content of $PO_4^{3-}$ in the chemical solution is higher than $1 \times 10^0$ and equal to or lower than $2 \times 10^6$.

Requirement B: the specific anions contain $BO_3^{3-}$, and a mass ratio of a content of $SO_4^{2-}$ to a content of $BO_3^{3-}$ in the chemical solution is higher than $1 \times 10^0$ and equal to or lower than $2 \times 10^6$.

[10] The chemical solution described in any one of [1] to [9], containing Mn, in which a content of Mn is 1 ppt by mass to 100 ppm by mass with respect to the total mass of the chemical solution.

[11] The chemical solution described in any one of [1] to [10], in which a content of Mn is 1 to 100 ppb by mass with respect to the total mass of the chemical solution.

[12] The chemical solution described in any one of [1] to [11], in which the halogen oxoacids contain at least one kind of periodic acids selected from the group consisting of orthoperiodic acid, a salt of orthoperiodic acid, metaperiodic acid, and a salt of metaperiodic acid.

[13] The chemical solution described in any one of [1] to [12], in which a content of the halogen oxoacids is equal to or lower than 37.0% by mass with respect to the total mass of the chemical solution.

[14] The chemical solution described in any one of [1] to [13], in which the content of the halogen oxoacids is 2.0% to 8.0% by mass with respect to the total mass of the chemical solution.

[15] The chemical solution described in any one of [1] to [14], in which the transition metal-containing substance contains at least one kind of metal selected from the group consisting of Ru, Rh, Ti, Ta, Co, Cr, Hf, Os, Pt, Ni, Mn, Cu, Zr, Mo, La, W, and Ir.

[16] The chemical solution described in any one of [1] to [15], in which the transition metal-containing substance contains a Ru-containing substance.

[17] The chemical solution described in any one of [1] to [16] that has a pH lower than 8.0.

[18] The chemical solution described in any one of [1] to [17] that has a pH of 2.5 to 5.0.

[19] A method for treating a substrate, including a step A of removing a transition metal-containing substance on a substrate by using the chemical solution described in any one of [1] to [18].

[20] The method for treating a substrate described in [19], in which the transition metal-containing substance contains a Ru-containing substance.

[21] The method for treating a substrate described in [19] or [20], in which the step A is a step A1 of performing a recess etching treatment on transition metal-containing wiring disposed on a substrate by using the chemical solution, a step A2 of removing a transition metal-containing film at an outer edge of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, or a step A5 of removing a transition metal-containing substance on a substrate, which has undergone a chemical mechanical polishing treatment, by using the chemical solution.

[22] The method for treating a substrate described in [21] that has the step A1 as the step A, further including:

a step B of treating the substrate obtained by the step A1 by using a solution selected from the group consisting of a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide after the step A1.

[23] The method for treating a substrate described in [22], in which the step A1 and the step B are alternately repeated.

[24] The method for treating a substrate described in any one of [19] to [23], further including a step C of performing a rinsing treatment on the substrate obtained by the step A by using a rinsing solution after the step A.

[25] The method for treating a substrate described in [24], in which the rinsing solution is a solution selected from the group consisting of hydrofluoric acid, hydrochloric acid, aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, and an aqueous orthoperiodic acid solution.

[26] The method for treating a substrate described in any one of [19] to [24], in which a temperature of the chemical solution is 20° C. to 75° C.

According to an aspect of the present invention, it is possible to provide a chemical solution having excellent storage stability and excellent defect inhibition performance.

Furthermore, according to an aspect of the present invention, it is possible to provide a method for treating a substrate.

DESCRIPTION OF THE PREFERRED EMBODIMENTS

Figure 1:
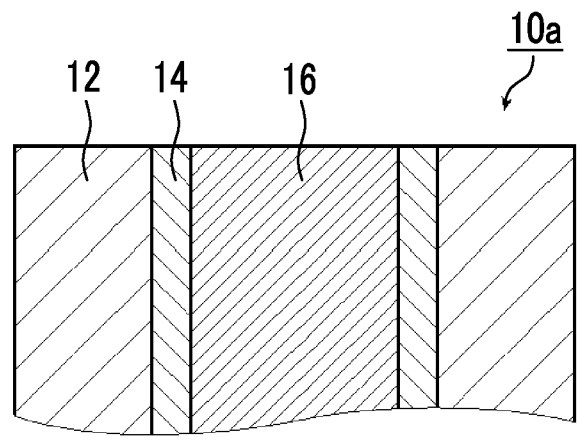
FIG. 1 is a schematic cross-sectional top view showing an example of an object to be treated used in a step A1.

Hereinafter, the present invention will be specifically described.

The following constituents will be described based on typical embodiments of the present invention in some cases, but the present invention is not limited to the embodiments.

In the present specification, in a case where there is no description regarding whether a group (atomic group) is substituted or unsubstituted, as long as the effects of the present invention are not reduced, the group includes both the group containing no substituent and the group containing a substituent. For example, "alkyl group" includes not only an alkyl group containing no substituent (unsubstituted alkyl group) but also an alkyl group containing a substituent (substituted alkyl group). The same is true of each compound.

In the present specification, unless otherwise specified, "exposure" includes not only the exposure using a mercury lamp, far ultraviolet rays represented by an excimer laser, X-rays, and Extreme Ultraviolet (EUV) light, but also lithography by particle beams such as electron beams and ion beams.

In the present specification, a range of numerical values described using "to" means a range including numerical values described before and after "to" as a lower limit and an upper limit.

In the present specification, the pH is a value measured at room temperature (25° C.) by using a pH meter (F-71S (product number), manufactured by Horiba, Ltd.).

In the present specification, a dry etching residue is a by-product generated as a result of performing dry etching (for example, plasma etching). For example, the dry etching residue refers to an organic residue derived from a photoresist, a Si-containing residue, a metal-containing residue (for example, a transition metal-containing residue), and the like.

[Chemical Solution]

The chemical solution according to an embodiment of the present invention is a chemical solution used for removing a transition metal-containing substance on a substrate.

The chemical solution according to the embodiment of the present invention contains halogen oxoacids and specific anions.

The halogen oxoacids are one or more kinds of compounds selected from the group consisting of a halogen oxoacid and a salt thereof.

The specific anions are one or more kinds of anions selected from the group consisting of $SO_4^{2-}$, $NO_3^-$, $PO_3^{-}$, and $BO_3^{3-}$.

In a case where the chemical solution contains one kind of the specific anion, a content of one kind of the specific anion is 5 ppb by mass to 1% by mass with respect to a total mass of the chemical solution.

In a case where the chemical solution contains two or more kinds of the specific anions, a content of each of two or more kinds of the specific anions is equal to or lower than 1% by mass with respect to the total mass of the chemical solution, and a content of at least one of two or more kinds of the specific anions is equal to or higher than 5 ppb by mass with respect to the total mass of the chemical solution.

It is unclear through what mechanism the object of the present invention is achieved by the chemical solution described above. According to the inventors of the present invention, the mechanism is assumed to be as below.

First, because the content of the specific anion in the chemical solution is equal to or higher than a predetermined amount, metallic components (such as metal ions) and the like generated in a case where a transition metal-containing substance on a substrate is removed using the chemical solution interact with the specific anion and hardly remain on the substrate, and defects derived from the metal components hardly occur. In addition, presumably, because the content of the specific anion in the chemical solution is equal to or lower than a predetermined amount, the components (particularly the halogen oxoacids) in the chemical solution may remain stable, and hence the storage stability may be improved.

<Halogen Oxoacids>

The chemical solution according to the embodiment of the present invention contains halogen oxoacids.

In the present specification, "halogen oxoacids" is a generic term for compounds selected from the group consisting of a halogen oxoacid and a salt thereof.

Examples of halogen atoms in the halogen oxoacid include fluorine (F), chlorine (Cl), bromine (Br), and iodine (I). Among these I is preferable.

The halogen oxoacids are, for example, compounds represented by "$MXO_n$".

Examples of M in "$MXO_n$" include a hydrogen atom, an alkali metal element (such as Na and K), other metal elements, and the like.

X is a halogen atom, preferably F, Cl, Br, or I, and more preferably I.

O is an oxygen atom.

n represents an integer of 1 to 4.

Examples of the halogen oxoacids include a fluorine oxoacid such as hypofluorous acid and a salt thereof; a chlorine oxoacid such as hypochlorous acid, chlorous acid, chloric acid, and perchloric acid and a salt thereof (such as sodium hypochlorite); a bromine oxoacid such as hypobromous acid, bromous acid, bromic acid, and perbromic acid and a salt thereof; and an iodine oxoacid such as hypoiodous acid, iodous acid, iodic acid, and periodic acid (such as orthoperiodic acid ($H_5IO_6$) and metaperiodic acid ($HIO_4$)) and a salt thereof.

As the halogen oxoacids, among these, iodic acid or a salt thereof is preferable, orthoperiodic acid, a salt of orthoperiodic acid, metaperiodic acid, or a salt of metaperiodic acid is more preferable, orthoperiodic acid or a salt of orthoperiodic acid is even more preferable, and orthoperiodic acid is particularly preferable.

In view of further improving the dissolving ability of the chemical solution, the content of the halogen oxoacids (total content in a case where the chemical solution contains a plurality of periodic acids) with respect to the total mass of the chemical solution is preferably equal to or higher than 0.1% by mass, more preferably equal to or higher than 0.5% by mass, and even more preferably equal to or higher than 2.0% by mass.

In view of further improving the smoothness of a portion to be treated, the content of the halogen oxoacids with respect to the total mass of the chemical solution is preferably equal to or lower than 40.0% by mass, more preferably equal to or lower than 37.0% by mass, even more preferably equal to or lower than 35.0% by mass, particularly preferably lower than 15.0% by mass, and most preferably equal to or lower than 8.0% by mass.

In view of further improving the balance between the dissolving ability of the chemical solution and the smoothness of the portion to be treated, the content of the halogen oxoacids with respect to the total mass of the chemical solution is, for example, preferably 0.5% to 35.0% by mass, and more preferably 2.0% to 8.0% by mass.

One kind of halogen oxoacids may be used singly, or two or more kinds of halogen oxoacids may be used. In a case where two or more kinds of halogen oxoacids are used, the total content thereof is preferably within the above range.

The content of the halogen oxoacids in the chemical solution is determined by ion chromatography. Specifically, examples of the device include Dionex ICS-2100 manufactured by Thermo Fisher Scientific. In a case where the composition of raw materials is known, the content of the halogen oxoacids may be determined by calculation.

<Specific Anion>

The chemical solution according to the embodiment of the present invention contains a specific anion.

The specific anion is one or more kinds of anions selected from $SO_4^{2-}$, $NO_3^-$, $PO_4^{3-}$, and $BO_3^{3-}$.

The chemical solution may contain one kind of specific anion or two or more kinds of specific anions.

In a case where the chemical solution contains one kind of the specific anion, the content of one kind of the specific anion is 5 ppb by mass to 1% by mass with respect to the total mass of the chemical solution.

Hereinafter, the content of 5 ppb by mass to 1% by mass with respect to the total mass of the chemical solution will be also called "predetermined content", and the specific anion present in the chemical solution at the predetermined content will be also called "anion at the predetermined content".

In view of further improving the storage stability of the chemical solution, the content of the anion at the predetermined content (that is, the predetermined content) is preferably equal to or lower than 0.5% by mass, and more preferably equal to or lower than 0.05% by mass.

In view of further improving the defect inhibition properties of the chemical solution, the content of the anion at the predetermined content (that is, the predetermined content) is preferably equal to or higher than 1 ppm by mass, and more preferably equal to or higher than 5 ppm by mass.

In a case where the chemical solution contains two or more kinds of the specific anions, the content of each of two or more kinds of the specific anions with respect to the total mass of the chemical solution is preferably equal to or lower than 1% by mass (in view of further improving the storage stability of the chemical solution, the content of each of two or more kinds of the specific anions is preferably equal to or lower than 0.5% by mass, and more preferably equal to or lower than 0.05% by mass).

Furthermore, the content of at least one of two or more kinds of the specific anions is equal to or higher than 5 ppb by mass with respect to the total mass of the chemical solution (in view of further improving the defect inhibition properties of the chemical solution, the content of at least one of two or more kinds of the specific anions is preferably equal to or higher than 1 ppm by mass, and more preferably equal to or higher than 5 ppm by mass).

In other words, the chemical solution according to the embodiment of the present invention contains at least one kind of the anion at the predetermined content, and the content of any of the specific anions does not exceed 1% by mass with respect to the total mass of the chemical solution.

In view of further improving the defect inhibition properties, the chemical solution preferably contains at least two kinds of the specific anions (preferably "at least three kinds of the specific anions and more preferably "four kinds of the specific anions ($SO_4^{2-}$, $NO_3^-$, $PO_4^{3-}$, and $BO_3^{3-}$)"), and the content of each of two kinds of the specific anions is preferably 5 ppb by mass to 1% by mass with respect to the total mass of the chemical solution.

In other words, the chemical solution preferably contains at least two kinds of anions at the predetermined content, more preferably contains at least three kinds of anions at the predetermined content, and even more preferably contains four kinds of anions at the predetermined content.

In a case where the chemical solution contains at least two kinds of anions at the predetermined content, as two kinds of the anions at the predetermined content, $SO_4^{2-}$ and $NO_3^-$ are preferable. The chemical solution may further contain another specific anion at the predetermined content.

In a case where the chemical solution contains at least three kinds of anions at the predetermined content, as three kinds of the anions at the predetermined content, $SO_4^{2-}$, $NO_3^-$, and one kind of anion selected from the group consisting of $PO_4^{3-}$ and $BO_3^{3-}$ are preferable. The chemical solution may further contain another specific anion at the predetermined content.

That is, in a case where the chemical solution contains two or three kinds of anions at the predetermined content, at least the amount of each of $SO_4^{2-}$ and $NO_3^-$ contained in the chemical solution preferably equals the predetermined content.

In a case where the chemical solution contains two or more kinds of anions at the predetermined content, the content of at least one of two or more kinds of the anions at the predetermined content (preferably at least $SO_4^{2-}$) is preferably 1 ppm by mass to 0.5% by mass, and more preferably 5 ppm by mass to 0.05% by mass. The content of each of two or more kinds of the anions at the predetermined content may be within the above range, or the total content of each of the anions at the predetermined content may be within the above range.

In a case where the chemical solution contains two or more kinds of the specific anions, the total content of each of the specific anions in the chemical solution with respect to the total mass of the chemical solution is preferably higher than 5 ppb by mass and equal to or lower than 2% by mass, more preferably 1 ppm by mass to 0.5% by mass, and even more preferably 5 ppm by mass to 0.05% by mass.

In view of further improving the storage stability of the chemical solution, the mass ratio of the content of halogen oxoacids to the total content of the specific anion in the chemical solution (content of halogen oxoacids/total content of specific anion (mass ratio)) is preferably equal to or higher than $1 \times 10^0$, and more preferably equal to or higher than $1 \times 10^2$.

In view of further improving the defect inhibition properties of the chemical solution, the mass ratio is preferably equal to or lower than $1 \times 10^{10}$, more preferably equal to or lower than $1 \times 10^7$, and even more preferably equal to or lower than $1 \times 10^5$.

Furthermore, the chemical solution preferably contains $SO_4^{2-}$ and $NO_3^-$ (the amount of each of $SO_4^{2-}$ and $NO_3^-$ contained in the chemical solution preferably equals the predetermined content), and the mass ratio of the content of $SO_4^{2-}$ to the content of $NO_3^-$ in the chemical solution (content of $SO_4^{2-}$/content of $NO_3^-$ (mass ratio)) is preferably higher than $1 \times 10^0$ and equal to or lower than $2 \times 10^6$ (more preferably $2 \times 10^0$ to $1 \times 10^4$, and even more preferably $4 \times 10^0$ to $1 \times 10^2$ (the chemical solution that satisfies this condition is also described as satisfying a requirement X).

In addition, the chemical solution preferably contains $SO_4^{2-}$ and $PO_4^{3-}$ (the amount of each of $SO_4^{2-}$ and $PO_4^{3-}$ contained in the chemical solution preferably equals the predetermined content), and the mass ratio of the content of $SO_4^{2-}$ to the content of $PO_4^{3-}$ in the chemical solution (content of $SO_4^{2-}$/content of $PO_4^{3-}$ (mass ratio)) is preferably higher than $1 \times 10^0$ and equal to or lower than $2 \times 10^6$ (more preferably $2 \times 10^0$ to $1 \times 10^4$, and even more preferably $4 \times 10^0$ to $1 \times 10^2$ (the chemical solution that satisfies this condition is also described as satisfying a requirement A).

Likewise, the chemical solution preferably contains $SO_4^{2-}$ and $BO_3^{3-}$ (the amount of each of $SO_4^{2-}$ and $BO_3^{3-}$ contained in the chemical solution preferably equals the predetermined content), and the mass ratio of the content of $SO_4^{2-}$ to the content of $BO_3^{3-}$ in the chemical solution (content of $SO_4^{2-}$/content of $BO_3^{3-}$ (mass ratio)) is preferably higher than $1 \times 10^0$ and equal to or lower than $2 \times 10^6$ (more preferably $2 \times 10^0$ to $1 \times 10^4$, and even more preferably $4 \times 10^0$ to $1 \times 10^{2-}$ (the chemical solution that satisfies this condition is also described as satisfying a requirement B).

The chemical solution preferably satisfies one or more requirements among the requirements X, A, and B, more preferably satisfies two or more requirements among the requirements X, A, and B, and even more preferably satisfies all of the three requirements X, A, and B.

Moreover, the chemical solution preferably satisfies at least one of the requirement A or requirement B, and more preferably satisfies both the requirements A and B.

The method of incorporating the specific anion into the chemical solution is not limited. For example, a raw material (such as sulfuric acid, nitric acid, phosphoric acid, boric acid, or a salt thereof) that contains a compound containing the specific anion as a main component may be added during the manufacturing of the chemical solution so that a predetermined amount of the specific anion is incorporated into the chemical solution. Alternatively, a raw material that contains a trace of the specific anion as an impurity and the like may be used for manufacturing the chemical solution, so that a predetermined amount of the specific anion is incorporated into the chemical solution.

The content of the specific anion in the chemical solution is determined by ion chromatography. Specifically, examples of the device include Dionex ICS-2100 manufactured by Thermo Fisher Scientific. Furthermore, in a case where the composition of raw materials is known, the content of the specific anion may be determined by calculation.

<Optional Components>

The chemical solution according to the embodiment of the present invention may contain other optional components in addition to the components described above.

Hereinafter, the optional components will be described.

(Manganese (Mn))

It is also preferable that the chemical solution according to the embodiment of the present invention contains manganese (Mn).

In a case where the chemical solution contains manganese, the storage stability of the chemical solution is further improved.

In the present invention, Mn means a metal component in the chemical solution that can be measured using a single particle inductively coupled plasma emission mass spectrophotometer. With this device, it is possible to measure the content of each of Mn as particles (particle-like Mn) and Mn in other forms (such as Mn ions) and to measure the total content of these. That is, Mn may be in the form of particles or in an ionic state.

Mn in the present specification can be measured, for example, using Agilent 8800 triple quadrupole ICP-MS (inductively coupled plasma mass spectrometry, for semiconductor analysis, option #200) manufactured by Agilent Technologies, Inc.

In a case where the chemical solution contains Mn, in view of further improving the balance between the storage stability and defect inhibition properties of the chemical solution, the content of Mn with respect to the total mass of the chemical solution is preferably 1 ppt by mass to 100 ppm by mass, and more preferably 1 to 100 ppb by mass.

In a case where the chemical solution contains Mn, in view of further improving the balance between the storage stability and defect inhibition properties of the chemical solution, the mass ratio of the total content of the specific anion to the content of Mn (total content of specific anion/content of Mn (mass ratio)) is preferably $1 \times 10^{-2}$ to $1 \times 10^5$, and more preferably $1 \times 10^2$ to $1 \times 10^4$.

(pH Adjuster)

The chemical solution according to the embodiment of the present invention may contain a pH adjuster.

Examples of the pH adjuster include an organic base, an inorganic base, an organic acid, and an inorganic acid. Among these, an organic base or an inorganic base is preferable, and an organic base is more preferable.

Specifically, as the pH adjuster, for example, a quaternary ammonium salt compound, aqueous ammonia, a water-soluble amine, hydrochloric acid, acetic acid, or hydrofluoric acid is preferable.

As the quaternary ammonium salt compound, a compound represented by Formula (1) is preferable.

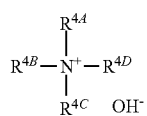

Formula (1)

In Formula (1), $R^{4A}$ to $R^{4D}$ each independently represent an alkyl group having 1 to 6 carbon atoms (for example, a methyl group, an ethyl group, a butyl group, or the like), a hydroxyalkyl group having 1 to 6 carbon atoms (for example, a hydroxymethyl group, a hydroxyethyl group, a hydroxybutyl group, or the like), a benzyl group, or an aryl group (for example, a phenyl group, a naphthyl group, a naphthalene group, or the like). Among these, an alkyl group, a hydroxyethyl group, or a benzyl group is preferable.

As the compound represented by Formula (1), at least one kind of quaternary ammonium hydroxide salt is preferable which is selected from the group consisting of tetramethylammonium hydroxide (TMAH), tetraethylammonium hydroxide (TEAH), tetrabutylammonium hydroxide (TBAH), trimethylhydroxyethylammonium hydroxide, methyltri(hydroxyethyl)ammonium hydroxide, tetra(hydroxyethyl)ammonium hydroxide, trimethylbenzylammonium hydroxide, bishydroxyethyldimethylammonium hydroxide, and choline. Among these, as the compound represented by Formula (1), at least one kind of compound is preferable which is selected from the group consisting of tetramethylammonium hydroxide, tetraethylammonium hydroxide, and tetrabutylammonium hydroxide.

Furthermore, the quaternary ammonium hydroxide compound described in JP2015-518068A may be also used. For example, tetramethylammonium hydroxide, bishydroxyethyldimethylammonium hydroxide, or trimethyl(hydroxyethyl)ammonium hydroxide is preferable because these compounds are effective for removing a transition metal-containing substance, leave few metal residues after use, are economical, and contribute to the stability of the chemical solution.

One kind of quaternary ammonium salt compound may be used singly, or two or more kinds of quaternary ammonium salt compounds may be used.

A pKa of the water-soluble amine is preferably 7.5 to 13.0. In the present specification, the water-soluble amine means an amine which can dissolve in an amount equal to or greater than 50 g in 1 L of water. Aqueous ammonia is not included in the water-soluble amine.

Examples of the water-soluble amine having a pKa of 7.5 to 13 include diglycolamine (DGA) (pKa=9.80), methylamine (pKa=10.6), ethylamine (pKa=10.6), propylamine (pKa=10.6), butylamine (pKa=10.6), pentylamine (pKa=10.0), ethanolamine (pKa=9.3), propanolamine (pKa=9.3), butanol amine (pKa=9.3), methoxyethylamine (pKa=10.0), methoxypropylamine (pKa=10.0), dimethylamine (pKa=10.8), diethylamine (pKa=10.9), dipropylamine (pKa=10.8), trimethylamine (pKa=9.80), and triethylamine (pKa=10.72).

As the water-soluble amine, unsubstituted hydroxylamine and a hydroxylamine derivative may also be used.

In the present specification, the pKa of the water-soluble amine is an acid dissociation constant in water. The acid dissociation constant in water can be measured using a spectrometer and potentiometry in combination.

Particularly, as the pH adjuster, tetramethylammonium hydroxide, tetraethylammonium hydroxide, tetrabutylammonium hydroxide, aqueous ammonia, a water-soluble amine (such as diglycolamine (DGA)), hydrochloric acid, acetic acid, or hydrofluoric acid is more preferable, and tetramethylammonium hydroxide, tetraethylammonium hydroxide, tetrabutylammonium hydroxide, aqueous ammonia, or a water-soluble amine is even more preferable.

As the pH adjuster, for example, tetramethylammonium hydroxide, bishydroxyethyldimethylammonium hydroxide, or trimethyl(hydroxyethyl)ammonium hydroxide is preferable because these compounds are effective for removing a transition metal-containing substance, leave few metal residues after use, are economical, and contribute to the stability of the chemical solution.

(Solvent) The chemical solution may contain a solvent.

Examples of the solvent include water and an organic solvent. Among these, water is preferable.

Water may contain a trace of components that are unavoidably mixed in.

Particularly, water having undergone a purification treatment such as distilled water, deionized water, or ultrapure water is preferable, and ultrapure water used for manufacturing semiconductors is more preferable.

The concentration of water in the chemical solution is not particularly limited, but is preferably equal to or higher than 50% by mass, more preferably equal to or higher than 60% by mass, and even more preferably equal to or higher than 85% by mass. The upper limit thereof is not particularly limited, but is preferably equal to or lower than 99.9% by mass, and more preferably equal to or lower than 92% by mass.

The chemical solution according to the embodiment of the present invention may contain other components in addition to the components described above.

Those other components are not particularly limited, and examples thereof include known components. Examples of the components include the surfactants described in paragraph "0026" of JP2014-093407A, paragraphs "0024" to "0027" of JP2013-055087A, paragraphs "0024" to "0027" of JP2013-012614A, and the like.

Examples thereof also include the additives (anticorrosive and the like) disclosed in paragraphs "0017" to "0038" of JP2014-107434A, paragraphs "0033" to "0047" of JP2014-103179A, paragraphs "0017" to "0049" of JP2014-093407A, and the like.

The pH of the chemical solution according to the embodiment of the present invention is not particularly limited, but is equal to or lower than 10.0 in many cases. Especially, in view of further improving the balance between the dissolving ability of the chemical solution and the smoothness of the portion to be treated, the pH of the chemical solution is preferably lower than 8.0, more preferably higher than 1.0 and equal to or lower than 6.0, even more preferably 2.5 to 5.0, and particularly preferably 3.0 to 5.0.

That is, in a case where the chemical solution contains a pH adjuster, the content of the pH adjuster with respect to the total mass of the chemical solution is preferably set so that the pH of the chemical solution falls into the above range.

The method for manufacturing the chemical solution according to the embodiment of the present invention is not particularly limited, and examples thereof include a method of thoroughly mixing together predetermined raw materials by using a stirrer such as a mixer.

Examples of the manufacturing method include a method of adjusting the pH to a preset value and then performing mixing and a method of performing mixing and then adjusting the pH to a preset value. Furthermore, it is also possible to use a method of manufacturing a concentrated solution and then adjusting the concentration thereof to a predetermined value by diluting the solution at the time of use. In addition, the concentrated solution can be used after being diluted and then adjusted to a preset pH. Moreover, a preset amount of water for dilution can be added to the concentrated solution, or a predetermined amount of the concentrated solution can be added to water for dilution.

<Object to be Treated>

The chemical solution according to the embodiment of the present invention is used for removing a transition metal-containing substance on a substrate.

In the present specification, "on a substrate" includes, for example, all of the front and back, the lateral surfaces, and the inside of grooves of a substrate, and the like. The transition metal-containing substance on a substrate includes not only a transition metal-containing substance which directly contacts the surface of the substrate but also a transition metal-containing substance which is on the substrate through another layer.

Examples of the transition metal contained in the transition metal-containing substance include a metal M selected from Ru (ruthenium), Rh (rhodium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

That is, as the transition metal-containing substance, a substance containing the metal M is preferable.

Particularly, the transition metal-containing substance is preferably a Ru-containing substance. That is, the chemical solution according to the embodiment of the present invention is more preferably used for removing the Ru-containing substance.

The content of Ru atoms in the Ru-containing substance with respect to the total mass of the Ru-containing substance is preferably equal to or higher than 10% by mass, more preferably equal to or higher than 30% by mass, even more preferably equal to or higher than 50% by mass, and still more preferably equal to or higher than 90% by mass. The upper limit thereof is not particularly limited, but is 100% by mass for example.

Furthermore, the transition metal-containing substance is preferably a Cu-containing substance. That is, the chemical solution according to the embodiment of the present invention is also preferably used for removing the Cu-containing substance.

The content of Cu atoms in the Cu-containing substance with respect to the total mass of the Cu-containing substance is preferably equal to or higher than 10% by mass, more preferably equal to or higher than 30% by mass, even more preferably equal to or higher than 50% by mass, and still more preferably equal to or higher than 90% by mass. The upper limit thereof is not particularly limited, but is 100% by mass for example.

The transition metal-containing substance only needs to be a substance containing a transition metal (transition metal atoms), and examples thereof include a simple transition metal, an alloy containing a transition metal, an oxide of a transition metal, a nitride of a transition metal, and an oxynitride of a transition metal. Among these, as the transition metal-containing substance, simple Ru, an alloy of Ru, an oxide of Ru, a nitride of Ru, or an oxynitride of Ru is preferable. Among these, as the transition metal-containing substance, simple Cu, an alloy of Cu, an oxide of Cu, a nitride of Cu, or an oxynitride of Cu is preferable.

Furthermore, the transition metal-containing substance may be a mixture containing two or more kinds of compounds among the above compounds.

The oxide, nitride, and oxynitride described above may be a composite oxide, a composite nitride, and a composite oxynitride containing a transition metal.

The content of transition metal atoms in the transition metal-containing substance with respect to the total mass of the transition metal-containing substance is preferably equal to or higher than 10% by mass, more preferably equal to or higher than 30% by mass, and even more preferably equal to or higher than 50% by mass. The upper limit thereof is 100% by mass because the transition metal-containing substance may be a transition metal.

The object to be treated is a substrate having a transition metal-containing substance. That is, the object to be treated includes at least a substrate and a transition metal-containing substance on the substrate.

The type of the substrate is not particularly limited, but is preferably a semiconductor substrate.

Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The type of the transition metal-containing substance on the substrate is as described above.

The form of the transition metal-containing substance on the substrate is not particularly limited. For example, the transition metal-containing substance may be disposed in the form of a film (transition metal-containing film), in the form of wiring (transition metal-containing wiring), or in the form of particles. As described above, the transition metal is preferably Ru, and the object to be treated preferably includes a substrate and a Ru-containing film, Ru-containing wiring, or a particle-like Ru-containing substance which is disposed on the substrate. In addition, the transition metal is preferably Cu, and the object to be treated preferably includes a substrate and a Cu-containing film, Cu-containing wiring, or a particle-like Cu-containing substance which is disposed on the substrate.

It is also preferable that two or more kinds of transition metal-containing substances are on the substrate. For example, both the Ru-containing substance (such as a Ru-containing film, Ru-containing wiring, and/or a particle-like Ru-containing substance) and Cu-containing substance (such as a Cu-containing film, Cu-containing wiring, and/or a particle-like Cu-containing substance) may be on the substrate at the same time. In a case where two or more kinds of transition metal-containing substances are on the substrate at the same time, two or more kinds of the transition metal-containing substances on the substrate may be separated from each other or uniformly mixed together.

Examples of the substrate, on which the transition metal-containing substance is disposed in the form of particles, include a substrate obtained by performing dry etching on a substrate on which a transition metal-containing film is disposed so that particle-like transition metal-containing substances are then attached to the substrate as residues as will be described later, and a substrate obtained by performing a chemical mechanical polishing (CMP) treatment on the transition metal-containing film so that particle-like transition metal-containing substances are then attached to the substrate as residues as will be described later.

The thickness of the transition metal-containing film is not particularly limited, and may be appropriately selected according to the use. For example, the thickness is preferably equal to or smaller than 50 nm, more preferably equal to or smaller than 20 nm, and even more preferably equal to or smaller than 10 nm.

The transition metal-containing film may be disposed only on one of the main surfaces of the substrate, or may be disposed on both the main surfaces of the substrate. Furthermore, the transition metal-containing film may be disposed on the entire main surface of the substrate, or may be disposed on a portion of the main surface of the substrate.

The object to be treated may include various layers and/or structures as desired in addition to the transition metal-containing substance. For example, metal wiring, a gate electrode, a source electrode, a drain electrode, an insulating layer, a ferromagnetic layer, and/or a non-magnetic layer, and the like may be disposed on the substrate.

The substrate may include the structure of an exposed integrated circuit, for example, an interconnection mechanism such as metal wiring and a dielectric material. Examples of metals and alloys used for the interconnection mechanism include aluminum, a copper-aluminum alloy, copper, titanium, tantalum, cobalt, silicon, titanium nitride, tantalum nitride, and tungsten. The substrate may include a layer of silicon oxide, silicon nitride, silicon carbide, and/or carbon-doped silicon oxide.

The size, thickness, shape, layer structure, and the like of the substrate are not particularly limited, and can be appropriately selected as desired.

As described above, the object to be treated used in the treatment method according to the embodiment of the present invention has a transition metal-containing substance on a substrate.

The method for manufacturing the object to be treated is not particularly limited. For example, a transition metal-containing film can be formed on a substrate by a sputtering method, a chemical vapor deposition (CVD) method, a molecular beam epitaxy (MBE) method, or the like. In a case where the transition metal-containing film is formed by a sputtering method, a CVD method, or the like, sometimes the transition metal-containing substance is also attached to the back surface of the substrate on which the transition metal-containing film is disposed (the surface opposite to the side of the transition metal-containing film).

Furthermore, transition metal-containing wiring may be formed on a substrate by performing the aforementioned method through a predetermined mask.

In addition, a substrate on which a transition metal-containing film or transition metal-containing wiring is disposed may be subjected to a predetermined treatment and used as an object to be treated by the treatment method according to an embodiment of the present invention.

For example, by performing dry etching on a substrate on which a transition metal-containing film or transition metal-containing wiring is disposed, a substrate having dry etching residues containing a transition metal may be manufactured. Furthermore, by performing CMP on a substrate on which a transition metal-containing film or transition metal-containing wiring is disposed, a substrate having a transition metal-containing substance may be manufactured.

[Method for Treating Substrate]

The method for treating a substrate according to an embodiment of the present invention (hereinafter, also called "present treatment method") includes a step A of removing a transition metal-containing substance on a substrate by using the chemical solution described above.

As described above, particularly, in a case where the transition metal-containing substance contains a Ru-containing substance, the method for treating a substrate according to the embodiment of the present invention is suitably used.

The chemical solution used in the present treatment method is as described above.

In addition, the substrate containing a transition metal-containing substance, which is an object to be treated by the present treatment method, is as described above.

Examples of the specific method of the step A include a method of bringing the substrate as an object to be treated, on which a transition metal-containing substance is disposed, into contact with the chemical solution.

The method of bringing the substrate into contact with the chemical solution is not particularly limited, and examples thereof include a method of immersing the object to be treated in the chemical solution put in a tank, a method of spraying the chemical solution onto the object to be treated, a method of causing the chemical solution to flow on the object to be treated, and any combination of these. Among these, the method of immersing the object to be treated in the chemical solution is preferable.

In order to further enhance the cleaning ability of the chemical solution, a mechanical stirring method may also be used.

Examples of the mechanical stirring method include a method of circulating the chemical solution on an object to be treated, a method of causing the chemical solution to flow on the object to be treated or spraying the chemical solution onto the object to be treated, a method of stirring the chemical solution by using ultrasonic or megasonic waves, and the like.

The treatment time of the step A can be appropriately adjusted.

The treatment time (the contact time between the chemical solution and the object to be treated) is not particularly limited, but is preferably 0.25 to 10 minutes, and more preferably 0.5 to 2 minutes.

The temperature of the chemical solution during the treatment is not particularly limited, but is preferably 20° C. to 75° C., more preferably 20° C. to 60° C., even more preferably 40° C. to 65° C., and still more preferably 50° C. to 65° C.

In the step A, only one kind of transition metal-containing substance on the substrate may be removed, or two or more kinds of transition metal-containing substances on the substrate may be removed.

In a case where two or more kinds of transition metal-containing substances are removed in the step A, two or more kinds of the transition metal-containing substances may be simultaneously removed by one treatment or may be treated separately.

Examples of the combination of two or more kinds of transition metal-containing substances include a combination of two or more kinds of metal-containing substances (two or more kinds of metal M-containing substances) belonging to the metal M described above.

Particularly, a combination including at least a Ru-containing substance and a Cu-containing substance is preferable.

In the step A, a treatment may be performed in which the concentration of the halogen oxoacids and/or the specific anion in the chemical solution is measured and, if necessary, a solvent (preferably water) is added to the chemical solution. In a case where this treatment is performed, the concentration of components in the chemical solution can be stably maintained in a predetermined range.

The concentration of the halogen oxoacids and/or the specific anion in the chemical solution is measured, for example, by ion chromatography. Specifically, examples of the device include Dionex ICS-2100 manufactured by Thermo Fisher Scientific.

Specifically, examples of suitable embodiments of the step A include a step A1 of performing a recess etching treatment on transition metal-containing wiring disposed on a substrate by using the chemical solution, a step A2 of removing a transition metal-containing film on outer edges of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, and a step A5 of removing a transition metal-containing substance on a substrate, which has undergone a chemical mechanical polishing treatment, by using the chemical solution.

Among these, as the step A, the step A2 or the step A3 is more preferable.

Hereinafter, the treatment method according to the embodiment of the present invention used in each of the above treatments will be described.

<Step A1>

Examples of the step A include a step A1 of performing a recess etching treatment on transition metal-containing wiring disposed on a substrate by using the chemical solution.

FIG. 1 is a schematic cross-sectional top view showing an example of a substrate including transition metal-containing wiring (hereinafter, also called "wiring substrate") which is an object to be treated by the recess etching treatment in the step A1.

A wiring substrate 10a shown in FIG. 1 has a substrate not shown in the drawing, an insulating film 12 including a groove disposed on the substrate, a barrier metal layer 14 disposed along the inner wall of the groove, and transition metal-containing wiring 16 that fills up the inside of the groove.

The substrate and the transition metal-containing wiring in the wiring substrate are as described above.

As the transition metal-containing wiring, Ru-containing wiring (wiring containing Ru) is preferable. It is preferable that the Ru-containing wiring contains simple Ru, an alloy of Ru, an oxide of Ru, a nitride of Ru, or an oxynitride of Ru.

As the transition metal-containing wiring, Cu-containing wiring (wiring containing Cu) is also preferable. It is preferable that the Cu-containing wiring contains simple Cu, an alloy of Cu, an oxide of Cu, a nitride of Cu, or an oxynitride of Cu.

The material constituting the barrier metal layer in the wiring substrate is not particularly limited, and examples thereof include TiN and TaN.

In FIG. 1, an embodiment is illustrated in which the wiring substrate has a barrier metal layer. However, the wiring substrate may not include the barrier metal layer.

Although not shown in FIG. 1, a liner layer may be disposed between the barrier metal layer 14 and the transition metal-containing wiring 16. The material constituting the liner layer is not particularly limited, and examples thereof include a Ru-containing substance and a Cu-containing substance.

The method for manufacturing the wiring substrate is not particularly limited, and examples thereof include a method including a step of forming an insulating film on a substrate, a step of forming a groove in the insulating film, a step of forming a barrier metal layer on the insulating film, a step of forming a transition metal-containing film that fills up the groove, and a step of performing a smoothing treatment on the transition metal-containing film.

The manufacturing method may include a step of forming a liner layer on the barrier metal layer between the step of forming a barrier metal layer on the insulating film and the step of forming a transition metal-containing film that fills up the groove.

In the step A1, by performing a recess etching treatment on the transition metal-containing wiring in the wiring substrate by using the aforementioned chemical solution, a portion of the transition metal-containing wiring can be removed, and a recess can be formed.

Figure 2:
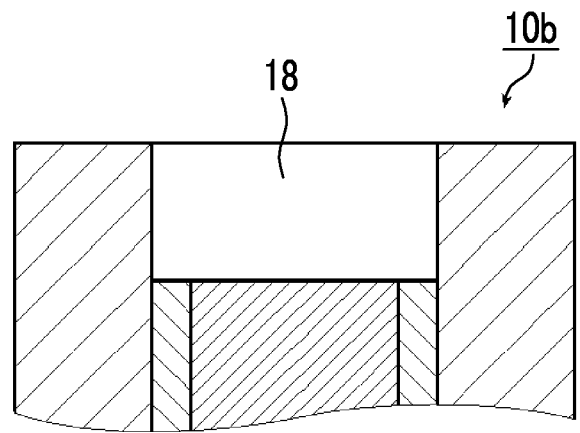
FIG. 2 is a schematic cross-sectional top view showing an example of an object to be treated having undergone the step A1.

More specifically, in a case where the step A1 is performed, as shown in the wiring substrate 10*b* in FIG. 2, a portion of the barrier metal layer 14 and the transition metal-containing wiring 16 is removed, and a recess 18 is formed.

Examples of the specific method of the step A1 include a method of bringing the wiring substrate into contact with the chemical solution.

The method of bringing the wiring substrate into contact with the chemical solution is as described above.

The suitable ranges of the contact time between the chemical solution and the wiring substrate and the temperature of the chemical solution are as described above.

After the step A1, if necessary, a step B of treating the substrate obtained by the step A1 by using a predetermined solution (hereinafter, also called "specific solution") may be performed.

Particularly, as described above, in a case where the barrier metal layer is disposed on the substrate, the solubility in the chemical solution according to the embodiment of the present invention varies between the component constituting the transition metal-containing wiring and the component constituting the barrier metal layer depending on the type of the components. In this case, it is preferable to adjust the degree of solubility of the transition metal-containing wiring and the barrier metal layer by using a solution that dissolves better the barrier metal layer.

In this respect, as the specific solution, a solution is preferable which poorly dissolves the transition metal-containing wiring but excellently dissolves the substance constituting the barrier metal layer.

Examples of the specific solution include a solution selected from the group consisting of a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), and a mixed solution of hydrochloric acid and aqueous hydrogen peroxide (HPM).

The composition of FPM is, for example, preferably in a range of "hydrofluoric acid:aqueous hydrogen peroxide:water=1:1:1" to "hydrofluoric acid:aqueous hydrogen peroxide:water=1:1:200" (volume ratio).

The composition of SPM is, for example, preferably in a range of "sulfuric acid:aqueous hydrogen peroxide:water=3:1:0" to "sulfuric acid:aqueous hydrogen peroxide:water=1:1:10" (volume ratio).

The composition of APM is, for example, preferably in a range of "aqueous ammonia:aqueous hydrogen peroxide:water=1:1:1" to "aqueous ammonia:aqueous hydrogen peroxide:water=1:1:30" (volume ratio).

The composition of HPM is, for example, preferably in a range of "hydrochloric acid:aqueous hydrogen peroxide:water=1:1:1" to "hydrochloric acid:aqueous hydrogen peroxide:water=1:1:30" (volume ratio).

The preferred compositional ratio described above means a compositional ratio determined in a case where the content of hydrofluoric acid is 49% by mass, the content of sulfuric acid is 98% by mass, the content of aqueous ammonia is 28% by mass, the content of hydrochloric acid is 37% by mass, and the content of aqueous hydrogen peroxide is 31% by mass.

Among these, in view of dissolving ability for the barrier metal layer, SPM, APM, or HPM is preferable.

In view of reducing roughness, APM, HPM, or FPM is preferable, and APM is more preferable.

In view of achieving excellent balance between performances, APM or HPM is preferable.

In the step B, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the chemical solution.

The contact time between the specific solution and the substrate obtained by the step A1 is, for example, preferably 0.25 to 10 minutes, and more preferably 0.5 to 5 minutes.

In the present treatment method, the step A1 and the step B may be performed alternately.

In a case where the steps are performed alternately, it is preferable that each of the step A1 and the step B is performed 1 to 10 times.

The step A1 is also preferably a step A1X of simultaneously removing two or more kinds of transition metal-containing substances (for example, two or more kinds of metal M-containing substances, and preferably a combination of a Ru-containing substance and a Cu-containing substance).

The step A1X is performed, for example, on a wiring substrate that includes at least transition metal-containing wiring and a liner layer, in which the transition metal-containing wiring and the liner layer are made of different transition metal-containing substances.

In this case, the wiring substrate is, for example, preferably a substrate that has Cu-containing wiring as a transition metal-containing wiring and a Ru-containing substance as a liner layer or has a Ru-containing wiring as a transition metal-containing wiring and a Cu-containing substance as a liner layer, and more preferably a substrate that has Cu-containing wiring as transition metal-containing wiring and a Ru-containing substance as a liner layer.

In a case where the step A1X is performed (preferably in a case where two or more kinds of transition metal-containing substances contain a Cu-containing substance, and more preferably in a case where two or more kinds of transition metal-containing substances contain a Ru-containing substance and a Cu-containing substance), in view of further improving the balance between the etching rate and the surface condition (such as smoothness) of the portion to be treated, the pH of the chemical solution is preferably 3.0 to 10.0, and more preferably 8.0 to 10.0.

It is considered that in a case where the pH of the chemical solution is 8.0 to 10.0, the chemical solution may etch the transition metal-containing substance while forming a layer on the surface of the transition metal-containing substance (particularly a Cu-containing substance) treated. Presumably, as a result, the transition metal-containing substance having undergone the treatment may have excellent surface properties (such as an oxidation-free surface having excellent smoothness).

Even in a case where the step A1 is the step A1X, the step B may be performed after the step A1X or performed alternately with the step A1X.

<Step A2>

Examples of the step A include a step A2 of removing a transition metal-containing film at the outer edge of a substrate, on which the transition metal-containing film is disposed, by using the chemical solution.

Figure 3:
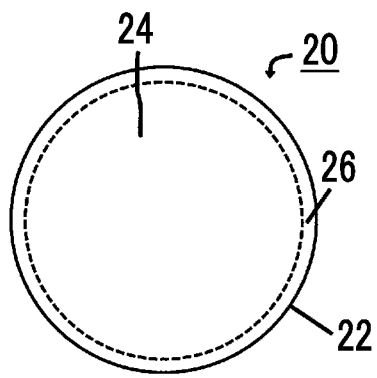
FIG. 3 is a schematic view showing an example of an object to be treated used in a step A2.

FIG. 3 is a schematic view (top view) showing an example of a substrate, on which a transition metal-containing film is disposed, as an object to be treated by the step A2.

An object 20 to be treated by the step A2 shown in FIG. 3 is a laminate including a substrate 22 and a transition metal-containing film 24 disposed on one main surface (entire region surrounded by the solid line) of the substrate 22. As will be described later, in step A2, the transition metal-containing film 24 positioned at an outer edge 26 (the region outside the broken line) of the object 20 to be treated is removed.

The substrate and the transition metal-containing film in the object to be treated are as described above.

As the transition metal-containing film, a Ru-containing film (film containing Ru) is preferable. It is preferable that the Ru-containing film contains simple Ru, an alloy of Ru, an oxide of Ru, a nitride of Ru, or an oxynitride of Ru.

The specific method of the step A2 is not particularly limited, and examples thereof include a method of supplying the chemical solution from a nozzle so that the chemical solution contacts only the transition metal-containing film at the outer edge of the substrate.

At the time of performing the treatment of the step A2, it is possible to preferably use the substrate treatment device and the substrate treatment method described in JP2010-267690A, JP2008-080288A, JP2006-100368A, and JP2002-299305A.

The method of bringing the object to be treated into contact with the chemical solution is as described above.

The suitable ranges of the contact time between the chemical solution and the object to be treated and the temperature of the chemical solution are as described above.

<Step A3>

Examples of the step A include a step A3 of removing a transition metal-containing substance attached to the back surface of a substrate, on which a transition metal-containing film is disposed, by using the chemical solution.

Examples of the object to be treated by the step A3 include the object to be treated used in the step A2. At the time of forming the object to be treated, which is constituted with a substrate and a transition metal-containing film disposed on one main surface of the substrate, used in the step A2, the transition metal-containing film is formed by sputtering, CVD, or the like. At this time, sometimes a transition metal-containing substance is attached to a surface (back surface) of the substrate that is opposite to the transition metal-containing film. The step A3 is performed to remove such a transition metal-containing substance in the object to be treated.

The specific method of the step A3 is not particularly limited, and examples thereof include a method of spraying the chemical solution so that the chemical solution contacts only the back surface of the substrate.

The method of bringing the object to be treated into contact with the chemical solution is as described above.

The suitable ranges of the contact time between the chemical solution and the object to be treated and the temperature of the chemical solution are as described above.

<Step A4>

Examples of the step A include a step A4 of removing a transition metal-containing substance on a substrate, which has undergone dry etching, by using the chemical solution.

Figure 4:
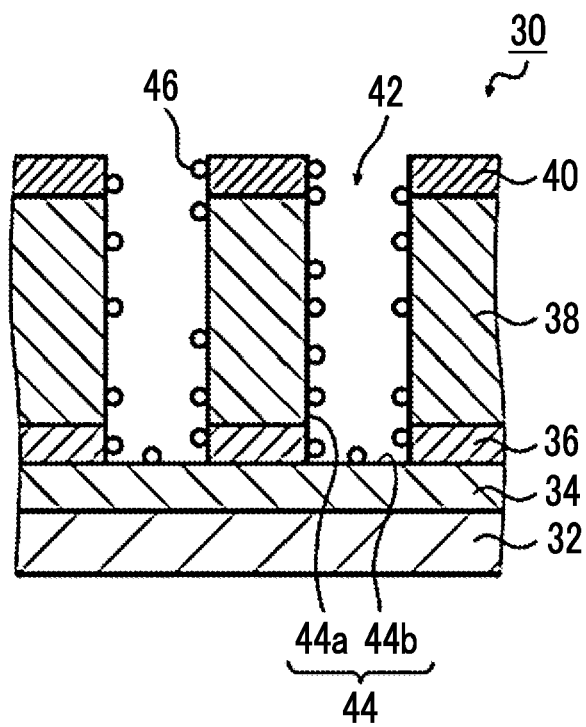
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a transition metal-containing film 34, an etch stop layer 36, an interlayer insulating film 38, a metal hard mask 40 in this order on a substrate 32. Through a dry etching process or the like, a hole 42 exposing the transition metal-containing film 34 is formed at a predetermined position. That is, the object to be treated shown in FIG. 4 is a laminate which comprises the substrate 32, the transition metal-containing film 34, the etch stop layer 36, the interlayer insulating film 38, and the metal hard mask 40 in this order and comprises the hole 42 that extends from the surface of the metal hard mask 40 to the surface of the transition metal-containing film 34 at the position of the opening portion of the mask 40. An inner wall 44 of the hole 42 is constituted with a cross-sectional wall 44a which includes the etch stop layer 36, the interlayer insulating film 38, and the metal hard mask 40, and a bottom wall 44b which includes the exposed transition metal-containing film 34. A dry etching residue 46 is attached to the inner wall 44.

The dry etching residue contains a transition metal-containing substance.

As the transition metal-containing film, a Ru-containing film (film containing Ru) is preferable. It is preferable that the Ru-containing film contains simple Ru, an alloy of Ru, an oxide of Ru, a nitride of Ru, or an oxynitride of Ru.

As the transition metal-containing substance, a Ru-containing substance is preferable. It is preferable that the Ru-containing substance contains simple Ru, an alloy of Ru, an oxide of Ru, a nitride of Ru, or an oxynitride of Ru.

As the interlayer insulating film and the metal hard mask, known materials are selected.

Although FIG. 4 describes an embodiment in which a metal hard mask is used, a resist mask formed of a known photoresist material may also be used.

Examples of the specific method of the step A4 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

<Step A5>

Examples of the step A include a step A5 of removing a transition metal-containing substance on a substrate, which has undergone a chemical mechanical polishing (CMP), by using the chemical solution.

The CMP technique is used for smoothing an insulating film, smoothing connection holes, and a process of manufacturing damascene wiring and the like. In some cases, a substrate having undergone CMP is contaminated with a large amount of particles used as abrasive particles, metal impurities, and the like. Therefore, it is necessary to remove these contaminants and wash the substrate before the next processing stage starts. By performing the step A5, it is possible to remove a transition metal-containing substance which is generated in a case where the object to be treated by CMP includes transition metal-containing wiring or a transition metal-containing film and attached onto the substrate.

As described above, examples of the object to be treated by the step A5 include a substrate having undergone CMP that includes a transition metal-containing substance.

As the transition metal-containing substance, a Ru-containing substance is preferable. It is preferable that the Ru-containing substance contains simple Ru, an alloy of Ru, an oxide of Ru, a nitride of Ru, or an oxynitride of Ru.

Examples of the specific method of the step A5 include a method of bringing the aforementioned object to be treated into contact with the chemical solution.

The method of bringing the wiring substrate into contact with the chemical solution is as described above.

The suitable ranges of the contact time between the chemical solution and the wiring substrate and the temperature of the chemical solution are as described above.

Furthermore, the step A may be CMP. That is, CMP may be performed using the chemical solution according to the embodiment of the present invention.

<Step C>

If necessary, the present treatment step may include a step C of performing a rinsing treatment on the substrate obtained by the step A by using a rinsing solution after the step A.

In a case where the chemical solution according to the embodiment of the present invention is brought into contact with the substrate, sometimes the halogen compound derived from the halogen oxoacids in the chemical solution according to the embodiment of the present invention is attached to the surface of the substrate as residual halogen (halogen residue). Such residual halogen (halogen residue) may negatively affect the subsequent processes and/or end products. By performing the rinsing step, it is possible to remove the residual halogen (halogen residue) from the surface of the substrate.

As the rinsing solution, for example, hydrofluoric acid (preferably 0.001% to 1% by mass hydrofluoric acid), hydrochloric acid (preferably 0.001% to 1% by mass hydrochloric acid), aqueous hydrogen peroxide (preferably 0.5% to 31% by mass aqueous hydrogen peroxide, and more preferably 3% to 15% by mass aqueous hydrogen peroxide), a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), a mixed solution of hydrochloric acid and aqueous hydrogen peroxide (HPM), aqueous carbon dioxide (preferably 10 to 60 ppm by mass aqueous carbon dioxide), aqueous ozone (preferably 10 to 60 ppm by mass aqueous ozone), aqueous hydrogen (preferably 10 to 20 ppm by mass aqueous hydrogen), an aqueous citric acid solution (preferably a 0.01% to 10% by mass aqueous citric acid solution), sulfuric acid (preferably a 1% to 10% by mass aqueous sulfuric acid solution), aqueous ammonia (preferably 0.01% to 10% by mass aqueous ammonia), isopropyl alcohol (IPA), an aqueous hypochlorous acid solution (preferably a 1% to 10% by mass aqueous hypochlorous acid solution), aqua regia (preferably aqua regia obtained by mixing together "37% by mass hydrochloric acid:60% by mass nitric acid" at a volume ratio of "2.6:1.4" to "3.4:0.6"), ultrapure water, nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous oxalic acid solution), acetic acid (preferably a 0.01% to 10% by mass aqueous acetic acid solution or an undiluted acetic acid solution), or an aqueous periodic acid solution (preferably a 0.5% to 10% by mass aqueous periodic acid solution, examples of the periodic acid include orthoperiodic acid and metaperiodic acid) is preferable.

The preferred conditions required to FPM, SPM, APM, and HPM are the same as the preferred conditions required, for example, to FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The aqueous ozone, aqueous carbon dioxide, and aqueous hydrogen mean aqueous solutions obtained by dissolving $O_3$, $CO_2$, and $H_2$ in water respectively.

As long as the purpose of the rinsing step is not impaired, these rinsing solutions may be used by being mixed together.

The rinsing solution may also contain an organic solvent.

Among the above, as the rinsing solution, in view of further reducing halogen remaining on the surface of the substrate after the rinsing step, aqueous carbon dioxide, aqueous ozone, aqueous hydrogen, hydrofluoric acid, an aqueous citric acid solution, hydrochloric acid, sulfuric acid, aqueous ammonia, aqueous hydrogen peroxide, SPM, APM, HPM, IPA, an aqueous hypochlorous acid solution, aqua regia, or FPM is preferable, and hydrofluoric acid, hydrochloric acid, aqueous hydrogen peroxide, SPM, APM, HPM, or FPM is more preferable.

Examples of the specific method of the step C include a method of bringing the substrate as an object to be treated obtained by the step A into contact with the rinsing solution.

The method of bringing the substrate into contact with the rinsing solution is performed by immersing the substrate in the rinsing solution put in a tank, spraying the rinsing solution onto the substrate, causing the rinsing solution to flow on the substrate, or any combination of these.

The treatment time (contact time between the rinsing solution and the object to be treated) is not particularly limited, but is 5 seconds to 5 minutes for example.

The temperature of the rinsing solution during the treatment is not particularly limited. Generally, the temperature of the rinsing solution is, for example, preferably 16° C. to 60° C., and more preferably 18° C. to 40° C. In a case where SPM is used as the rinsing solution, the temperature thereof is preferably 90° C. to 250° C.

If necessary, the present treatment method may include a step D of performing a drying treatment after the step C. The method of the drying treatment is not particularly limited, and examples thereof include spin drying, causing a drying gas to flow on the substrate, heating the substrate by heating means such as a hot plate or an infrared lamp, isopropyl alcohol (IPA) vapor drying, Marangoni drying, Rotagoni drying, and any combination of these.

The drying time varies with the specific method to be used, but is about 30 seconds to a few minutes in general.

The present treatment method may be performed in combination before or after other steps performed on a substrate. While being performed, the present treatment method may be incorporated into those other steps. Alternatively, while those other steps are being performed, the treatment method according to the embodiment of the present invention may be incorporated into the steps and performed.

Examples of those other steps include a step of forming each structure such as metal wiring, a gate structure, a source structure, a drain structure, an insulating layer, a ferromagnetic layer and/or a non-magnetic layer (layer formation, etching, chemical mechanical polishing, modification, and the like), a step of forming resist, an exposure step and a removing step, a heat treatment step, a washing step, an inspection step, and the like.

The present treatment method may be performed in the back end process (BEOL: Back end of the line) or in the front end process (FEOL: Front end of the line). However, from the viewpoint of enabling the effects of the present invention to be further demonstrated, it is preferable to perform the present treatment method in the front end process.

In addition, the chemical solution may be applied, for example, to NAND, dynamic random access memory (DRAM), static random access memory (SRAM), resistive random access memory (ReRAM), ferroelectric random access memory (FRAM (registered trademark)), magnetoresistive random access memory (MRAM), phase change random access memory (PRAM), or the like, or applied to a logic circuit, a processor, or the like.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples.

[Preparation of Chemical Solution]

Chemical solutions to be used in each test were prepared according to the formulations shown in the following Table 1.

The halogen oxoacids, the compound used as a supply source of the specific anion, and the pH adjuster used for preparing the chemical solutions will be shown below. All the raw materials used were semiconductor grade high-purity raw materials.

Before being used for preparing a chemical solution, the halogen oxoacids were dissolved in water, thereby obtaining an aqueous solution. The obtained aqueous solution was purified by an ion exchange method. In the form of being incorporated into the purified aqueous solution, the halogen oxoacids were used for preparing a chemical solution.

(Halogen Oxoacids)
Orthoperiodic acid
Metaperiodic acid
Perbromic acid
Bromic acid
Bromous acid
Hypobromous acid
Perchloric acid
Chloric acid
Chlorous acid
Hypochlorous acid
Hypofluorous acid
(Supply Source of Specific Anion)
$H_2SO_4$: sulfuric acid
$HNO_3$: nitric acid
$H_3PO_4$: phosphoric acid
$H_3BO_3$: boric acid
(pH Adjuster)
TMAH: tetramethylammonium hydroxide
TEAH: tetraethylammonium hydroxide
TBAH: tetrabutylammonium hydroxide
DGA: diglycolamine
Aqueous ammonia (28% by mass aqueous ammonia)
Acetic acid
Hydrochloric acid (37% by mass hydrochloric acid)
Hydrofluoric acid (49% by mass hydrofluoric acid)
(Supply Source of Mn)
Mn: manganese (simple Mn)
[Test and Evaluation]
<Preparation of Chemical Solution>

Halogen oxoacids were mixed with a predetermined amount of water (aqueous solution of halogen oxoacids). Then, the supply source of the specific anion and the pH adjuster were added thereto, thereby obtaining chemical solutions formulated as shown in Table 1.

In a case where the chemical solution contained Mn, a solution obtained by mixing together components other than Mn was brought into contact with simple Mn so that a predetermined amount of Mn was eluted into the solution.

In Table 1, what is described in "Content" in the column of "Specific anion" shows that the supply source of the corresponding specific anion was added so that the content of each specific anion with respect to the total mass of the chemical solution was the value described in the column of "Content".

The amount of the pH adjuster added was set so that the chemical solution had pH shown in the column of "pH of chemical solution".

The rest (balance) of the chemical solution other than the components described in the table is water.

<Storage Stability>

Immediately after being prepared, the chemical solutions were used to carry out the following dissolving ability test.

Furthermore, after being prepared, the chemical solutions were subjected to a storage treatment for 1 month in an environment at 60° C. and then used to measure the dissolving ability thereof in the following manner.

(Measurement of Dissolving Ability)

Substrates were prepared in which a ruthenium layer was formed on one surface of a commercial silicon wafer (diameter: 12 inches) by a chemical vapor deposition (CVD) method.

Each of the obtained substrates was put in a container filled with a chemical solution of each of the examples or comparative examples, and as a ruthenium layer removal treatment, the chemical solution was stirred for 0.5 minutes. The temperature of the chemical solution was 25° C.

From the difference between the thickness of the ruthenium layer before the treatment and the thickness of the ruthenium layer after the treatment, the etching rate was calculated.

In all of the chemical solutions, the etching rate was equal to or higher than 50 Å/min immediately after the preparation (before the storage treatment).

The reduction rate of the etching rate resulting from the storage treatment of the chemical solution was determined by the following equation, and the storage stability of the chemical solution was evaluated based on the following standard.

Reduction rate of etching rate (%)=(etching rate of chemical solution immediately after preparation−etching rate of chemical solution after storage treatment)/(etching rate of chemical solution immediately after preparation)×100

A+: the reduction rate of the etching rate is lower than 5%.
A: the reduction rate of the etching rate is equal to or higher than 5% and lower than 10%.
B: the reduction rate of the etching rate is equal to or higher than 10% and lower than 20%.

C: the reduction rate of the etching rate is equal to or higher than 20% and lower than 50%.

D: the reduction rate of the etching rate is equal to or higher than 50% and lower than 90%.

E: the reduction rate of the etching rate is equal to or higher than 90%.

<Residual Metal Inhibition Properties (Defect Inhibition Properties)>

Immediately after being prepared, the chemical solution was sprayed for 1 minute on a silicon wafer having a diameter of 300 mm at a flow rate of 1.5 L/min. Then, water was sprayed for 1 minute on the silicon wafer at a flow rate of 1.5 L/min. Finally, nitrogen gas was sprayed on the silicon wafer at a flow rate of 50 L/min.

Thereafter, the surface of the silicon wafer was analyzed using electron spectroscopy for chemical analysis (ESCA, device name: PHI Quantera SXM™), and the concentration of residual metal atoms on the surface of the silicon wafer (atoms/cm$^2$) was measured and evaluated according to the following standard.

According to the evaluation, it can be said that the higher the residual metal inhibition properties of the chemical solution, the better the defect inhibition properties of the chemical solution.

A: lower than $1\times10^7$ atoms/cm$^2$

B: equal to or higher than $1\times10^7$ atoms/cm$^{2-}$ and lower than $1\times10^8$ atoms/cm$^2$ C: equal to or higher than $1\times10^8$ atoms/cm$^{2-}$ and lower than $1\times10^9$ atoms/cm$^2$ D: equal to or higher than $1\times10^9$ atoms/cm$^{2-}$ and lower than $5\times10^9$ atoms/cm$^2$ E: equal to or higher than $5\times10^9$ atoms/cm$^{2-}$ and lower than $1\times10^{10}$ atoms/cm$^2$ F: equal to or higher than $1\times10^{10}$ atoms/cm$^2$ The results are shown in Table 1.

In Table 1, "E+n (n is an integer)" and "E−n (n is an integer)" mean "$\times10^{+n}$" and "$\times10^{-n}$" respectively.

What is described in the column of "Content" in the column of "Specific anion" means "% by mass" in a case where a certain unit is not described in the column. For example, in the chemical solution of Example 1, the content of $SO_4^{2-}$ is 0.25% by mass (=2.5E-01% by mass) with respect to the total mass of the chemical solution.

The column of "Halogen oxoacids/specific anion" means the mass ratio of the content of the halogen oxoacids to the content of the specific anion (total content in a case where the chemical solution contains two or more kinds of specific anions) in the chemical solution.

The column of "$SO_4^{2-}/NO_3^-$" means the mass ratio of the content of $SO_4^{2-}$ to the content of $NO_3^-$ in the chemical solution.

The column of "$SO_4^{2-}/PO_4^{3-}$" means the mass ratio of the content of $SO_4^{2-}$ to the content of $PO_4^{3-}$ in the chemical solution.

The column of "$SO_4^{2-}/BO_3^{3-}$" means the mass ratio of the content of $SO_4^{2-}$ to the content of $BO_3^{3-}$ in the chemical solution.

The column of "Specific anion/Mn" means the mass ratio of the content of the specific anion to the content of Mn in the chemical solution.

TABLE 1

| | Composition of chemical solution | | | | | | | |
|---|---|---|---|---|---|---|---|---|
| | Halogen oxoacids | | Specific anion | | | | | |
| | | | $SO_4^{2-}$ | $NO_3^-$ | $PO_4^{3-}$ | $BO_3^{3-}$ | Mn | | |
| | Type | Content % By mass | Content % By mass | Content % By mass | Content % By mass | Content % By mass | Content % By mass | pH adjuster Type | Water Content |
| Example 1 | Orthoperiodic acid | 2.0 | 2.5E−01 | | | | | N/A | Balance |
| Example 2 | Orthoperiodic acid | 8.0 | 1.0E+00 | | | | | N/A | Balance |
| Example 3 | Orthoperiodic acid | 8.0 | 1.0E−01 | | | | | N/A | Balance |
| Example 4 | Orthoperiodic acid | 15.0 | 5.0E−01 | | | | | N/A | Balance |
| Example 5 | Orthoperiodic acid | 25.0 | 8.0E−01 | | | | | N/A | Balance |
| Example 6 | Orthoperiodic acid | 37.0 | 1.0E+00 | | | | | N/A | Balance |
| Example 7 | Orthoperiodic acid | 8.0 | 1.0E−02 | | | | | N/A | Balance |
| Example 8 | Orthoperiodic acid | 8.0 | 1.0E−03 | | | | | N/A | Balance |
| Example 9 | Orthoperiodic acid | 8.0 | 1.0E−04 | | | | | N/A | Balance |
| Example 10 | Orthoperiodic acid | 8.0 | 5.0E−04 | | | | | N/A | Balance |
| Example 11 | Orthoperiodic acid | 8.0 | 5.0E−07 | | | | | N/A | Balance |
| Example 12 | Orthoperiodic acid | 2.0 | | 2.5E−01 | | | | N/A | Balance |
| Example 13 | Orthoperiodic acid | 8.0 | | 1.0E+00 | | | | N/A | Balance |
| Example 14 | Orthoperiodic acid | 8.0 | | 1.0E−01 | | | | N/A | Balance |
| Example 15 | Orthoperiodic acid | 15.0 | | 5.0E−01 | | | | N/A | Balance |

TABLE 1-continued

| | | | | | | |
|---|---|---|---|---|---|---|
| Example 16 | Orthoperiodic acid | 25.0 | 8.0E−01 | | N/A | Balance |
| Example 17 | Orthoperiodic acid | 37.0 | 1.0E+00 | | N/A | Balance |
| Example 18 | Orthoperiodic acid | 8.0 | 1.0E−02 | | N/A | Balance |
| Example 19 | Orthoperiodic acid | 8.0 | 1.0E−03 | | N/A | Balance |
| Example 20 | Orthoperiodic acid | 8.0 | 1.0E−04 | | N/A | Balance |
| Example 21 | Orthoperiodic acid | 8.0 | 5.0E−04 | | N/A | Balance |
| Example 22 | Orthoperiodic acid | 8.0 | 5.0E−07 | | N/A | Balance |
| Example 23 | Orthoperiodic acid | 2.0 | | 2.5E−01 | N/A | Balance |
| Example 24 | Orthoperiodic acid | 8.0 | | 1.0E+00 | N/A | Balance |
| Example 25 | Orthoperiodic acid | 8.0 | | 1.0E−01 | N/A | Balance |
| Example 26 | Orthoperiodic acid | 15.0 | | 5.0E−01 | N/A | Balance |
| Example 27 | Orthoperiodic acid | 25.0 | | 8.0E−01 | N/A | Balance |
| Example 28 | Orthoperiodic acid | 37.0 | | 1.0E+00 | N/A | Balance |
| Example 29 | Orthoperiodic acid | 8.0 | | 1.0E−02 | N/A | Balance |
| Example 30 | Orthoperiodic acid | 8.0 | | 1.0E−03 | N/A | Balance |

| | pH of chemical solution | Halogen oxoacids/ Specific anion | $SO_4^{2-}/NO^{3-}$ | $SO_4^{2-}/PO_4^{3-}$ | $SO_4^{2-}/BO_3^{3-}$ | Specific anion/Mn | Storage stability | Defect inhibition properties |
|---|---|---|---|---|---|---|---|---|
| Example 1 | 1.0 | 8.0E+00 | | | | | D | C |
| Example 2 | 1.0 | 8.0E+00 | | | | | D | C |
| Example 3 | 1.0 | 8.0E+01 | | | | | C | C |
| Example 4 | 0.5 | 3.0E+01 | | | | | D | C |
| Example 5 | 0.3 | 3.1E+01 | | | | | D | C |
| Example 6 | 0.1 | 3.7E+01 | | | | | D | C |
| Example 7 | 1.0 | 8.0E+02 | | | | | B | D |
| Example 8 | 1.0 | 8.0E+03 | | | | | B | D |
| Example 9 | 1.0 | 8.0E+04 | | | | | B | D |
| Example 10 | 1.0 | 1.6E+04 | | | | | B | D |
| Example 11 | 1.0 | 1.6E+07 | | | | | A | E |
| Example 12 | 1.0 | 8.0E+00 | | | | | D | C |
| Example 13 | 1.0 | 8.0E+00 | | | | | D | C |
| Example 14 | 1.0 | 8.0E+01 | | | | | C | C |
| Example 15 | 0.5 | 3.0E+01 | | | | | D | C |
| Example 16 | 0.3 | 3.1E+01 | | | | | D | C |
| Example 17 | 0.1 | 3.7E+01 | | | | | D | C |
| Example 18 | 1.0 | 8.0E+02 | | | | | B | D |
| Example 19 | 1.0 | 8.0E+03 | | | | | B | D |
| Example 20 | 1.0 | 8.0E+04 | | | | | B | D |
| Example 21 | 1.0 | 1.6E+04 | | | | | B | D |
| Example 22 | 1.0 | 1.6E+07 | | | | | A | E |
| Example 23 | 1.0 | 8.0E+00 | | | | | D | C |
| Example 24 | 1.0 | 8.0E+00 | | | | | D | C |
| Example 25 | 1.0 | 8.0E+01 | | | | | C | C |
| Example 26 | 0.5 | 3.0E+01 | | | | | D | C |
| Example 27 | 0.3 | 3.1E+01 | | | | | D | C |
| Example 28 | 0.1 | 3.7E+01 | | | | | D | C |
| Example 29 | 1.0 | 8.0E+02 | | | | | B | D |
| Example 30 | 1.0 | 8.0E+03 | | | | | B | D |

TABLE 1

| | Composition of chemical solution | | | | | | | | |
|---|---|---|---|---|---|---|---|---|---|
| | Halogen oxoacids | | Specific anion | | | | Mn | | |
| | | | $SO_4^{2-}$ | $NO^{3-}$ | $PO_4^{3-}$ | $BO_3^{3-}$ | | | |
| | Type | Content % By mass | Content % By mass | Content % By mass | Content % By mass | Content % By mass | Content % By mass | pH adjuster Type | Water Content |
| Example 31 | Orthoperiodic acid | 8.0 | | | 1.0E−04 | | | N/A | Balance |
| Example 32 | Orthoperiodic acid | 8.0 | | | 5.0E−04 | | | N/A | Balance |
| Example 33 | Orthoperiodic acid | 8.0 | | | 5.0E−07 | | | N/A | Balance |
| Example 34 | Orthoperiodic acid | 2.0 | | | | 2.5E−01 | | N/A | Balance |
| Example 35 | Orthoperiodic acid | 8.0 | | | | 1.0E+00 | | N/A | Balance |
| Example 36 | Orthoperiodic acid | 8.0 | | | | 1.0E−01 | | N/A | Balance |
| Example 37 | Orthoperiodic acid | 15.0 | | | | 5.0E−01 | | N/A | Balance |
| Example 38 | Orthoperiodic acid | 25.0 | | | | 8.0E−01 | | N/A | Balance |
| Example 39 | Orthoperiodic acid | 37.0 | | | | 1.0E+00 | | N/A | Balance |
| Example 40 | Orthoperiodic acid | 8.0 | | | | 1.0E−02 | | N/A | Balance |
| Example 41 | Orthoperiodic acid | 8.0 | | | | 1.0E−03 | | N/A | Balance |
| Example 42 | Orthoperiodic acid | 8.0 | | | | 1.0E−04 | | N/A | Balance |
| Example 43 | Orthoperiodic acid | 8.0 | | | | 5.0E−04 | | N/A | Balance |
| Example 44 | Orthoperiodic acid | 8.0 | | | | 5.0E−07 | | N/A | Balance |
| Example 45 | Orthoperiodic acid | 8.0 | 1.0E+00 | 1.0E−01 | | | | N/A | Balance |
| Example 46 | Orthoperiodic acid | 8.0 | 1.0E−01 | 1.0E−02 | | | | N/A | Balance |
| Example 47 | Orthoperiodic acid | 8.0 | 1.0E−02 | 1.0E−03 | | | | N/A | Balance |
| Example 48 | Orthoperiodic acid | 8.0 | 1.0E−03 | 1.0E−04 | | | | N/A | Balance |
| Example 49 | Orthoperiodic acid | 8.0 | 1.0E−04 | 1.0E−05 | | | | N/A | Balance |
| Example 50 | Orthoperiodic acid | 8.0 | 6.4E−03 | 8.0E−04 | | | | N/A | Balance |
| Example 51 | Orthoperiodic acid | 8.0 | 5.0E−04 | 5.0E−05 | | | | N/A | Balance |
| Example 52 | Orthoperiodic acid | 8.0 | 5.0E−06 | 5.0E−07 | | | | N/A | Balance |
| Example 53 | Orthoperiodic acid | 8.0 | 1.0E−02 | 1.0E−05 | | | | N/A | Balance |
| Example 54 | Orthoperiodic acid | 8.0 | 1.0E+00 | 5.0E−07 | | | | N/A | Balance |
| Example 55 | Orthoperiodic acid | 8.0 | 1.0E+00 | 1.0E−01 | 1.0E−01 | | | N/A | Balance |
| Example 56 | Orthoperiodic acid | 8.0 | 1.0E−01 | 1.0E−02 | 1.0E−02 | | | N/A | Balance |
| Example 57 | Orthoperiodic acid | 8.0 | 1.0E−02 | 1.0E−03 | 1.0E−03 | | | N/A | Balance |
| Example 58 | Orthoperiodic acid | 8.0 | 1.0E−03 | 1.0E−04 | 1.0E−04 | | | N/A | Balance |
| Example 59 | Orthoperiodic acid | 8.0 | 1.0E−04 | 1.0E−05 | 1.0E−05 | | | N/A | Balance |
| Example 60 | Orthoperiodic acid | 8.0 | 5.0E−04 | 5.0E−05 | 5.0E−05 | | | N/A | Balance |

| | pH of chemical solution | Halogen oxoacids/ Specific anion | $SO_4^{2-}/NO^{3-}$ | $SO_4^{2-}/PO_4^{3-}$ | $SO_4^{2-}/BO_3^{3-}$ | Specific anion/Mn | Storage stability | Defect inhibition properties |
|---|---|---|---|---|---|---|---|---|
| Example 31 | 1.0 | 8.0E+04 | | | | | B | D |
| Example 32 | 1.0 | 1.6E+04 | | | | | B | D |
| Example 33 | 1.0 | 1.6E+07 | | | | | A | E |
| Example 34 | 1.0 | 8.0E+00 | | | | | D | C |

TABLE 1-continued

| | | | | | | | |
|---|---|---|---|---|---|---|---|
| Example 35 | 1.0 | 8.0E+00 | | | | D | C |
| Example 36 | 1.0 | 8.0E+01 | | | | C | C |
| Example 37 | 0.5 | 3.0E+01 | | | | D | C |
| Example 38 | 0.3 | 3.1E+01 | | | | D | C |
| Example 39 | 0.1 | 3.7E+01 | | | | D | C |
| Example 40 | 1.0 | 8.0E+02 | | | | B | D |
| Example 41 | 1.0 | 8.0E+03 | | | | B | D |
| Example 42 | 1.0 | 8.0E+04 | | | | B | D |
| Example 43 | 1.0 | 1.6E+04 | | | | B | D |
| Example 44 | 1.0 | 1.6E+07 | | | | A | E |
| Example 45 | 1.0 | 7.3E+00 | 1.0E+01 | | | D | B |
| Example 46 | 1.0 | 7.3E+01 | 1.0E+01 | | | C | B |
| Example 47 | 1.0 | 7.3E+02 | 1.0E+01 | | | B | C |
| Example 48 | 1.0 | 7.3E+03 | 1.0E+01 | | | B | C |
| Example 49 | 1.0 | 7.3E+04 | 1.0E+01 | | | B | C |
| Example 50 | 1.0 | 1.1E+03 | 8.0E+00 | | | B | C |
| Example 51 | 1.0 | 1.5E+04 | 1.0E+01 | | | B | C |
| Example 52 | 1.0 | 1.5E+06 | 1.0E+01 | | | A | D |
| Example 53 | 1.0 | 8.0E+02 | 1.0E+03 | | | B | C |
| Example 54 | 1.0 | 8.0E+00 | 2.0E+06 | | | D | B |
| Example 55 | 1.0 | 6.7E+00 | 1.0E+01 | 1.0E+01 | | D | A |
| Example 56 | 1.0 | 6.7E+01 | 1.0E+01 | 1.0E+01 | | C | B |
| Example 57 | 1.0 | 6.7E+02 | 1.0E+01 | 1.0E+01 | | B | B |
| Example 58 | 1.0 | 6.7E+03 | 1.0E+01 | 1.0E+01 | | B | C |
| Example 59 | 1.0 | 6.7E+04 | 1.0E+01 | 1.0E+01 | | B | C |
| Example 60 | 1.0 | 1.3E+04 | 1.0E+01 | 1.0E+01 | | B | C |

TABLE 1

| | Composition of chemical solution | | | | | | | | |
|---|---|---|---|---|---|---|---|---|---|
| | Halogen oxoacids | | Specific anion | | | | Mn | | |
| | | | $SO_4^{2-}$ | $NO^{3-}$ | $PO_4^{3-}$ | $BO_3^{3-}$ | | | |
| | Type | Content % By mass | Content % By mass | Content % By mass | Content % By mass | Content % By mass | Content % By mass | pH adjuster Type | Water Content |
| Example 61 | Orthoperiodic acid | 8.0 | 5.0E−06 | 5.0E−07 | 5.0E−07 | | | N/A | Balance |
| Example 62 | Orthoperiodic acid | 8.0 | 1.0E−02 | 1.0E−05 | 1.0E−05 | | | N/A | Balance |
| Example 63 | Orthoperiodic acid | 8.0 | 1.0E+00 | 5.0E−07 | 5.0E−07 | | | N/A | Balance |
| Example 64 | Orthoperiodic acid | 8.0 | 1.0E+00 | 1.0E−01 | | 1.0E−01 | | N/A | Balance |
| Example 65 | Orthoperiodic acid | 8.0 | 1.0E−01 | 1.0E−02 | | 1.0E−02 | | N/A | Balance |
| Example 66 | Orthoperiodic acid | 8.0 | 1.0E−02 | 1.0E−03 | | 1.0E−03 | | N/A | Balance |
| Example 67 | Orthoperiodic acid | 8.0 | 1.0E−03 | 1.0E−04 | | 1.0E−04 | | N/A | Balance |
| Example 68 | Orthoperiodic acid | 8.0 | 1.0E−04 | 1.0E−05 | | 1.0E−05 | | N/A | Balance |
| Example 69 | Orthoperiodic acid | 8.0 | 5.0E−04 | 5.0E−05 | | 5.0E−05 | | N/A | Balance |
| Example 70 | Orthoperiodic acid | 8.0 | 5.0E−06 | 5.0E−07 | | 5.0E−07 | | N/A | Balance |
| Example 71 | Orthoperiodic acid | 8.0 | 1.0E−02 | 1.0E−05 | 1.0E−05 | 1.0E−05 | | N/A | Balance |
| Example 72 | Orthoperiodic acid | 8.0 | 1.0E+00 | 5.0E−07 | 5.0E−07 | 5.0E−07 | | N/A | Balance |
| Example 73 | Orthoperiodic acid | 8.0 | 1.0E+00 | 1.0E−01 | 1.0E−01 | 1.0E−01 | | N/A | Balance |
| Example 74 | Orthoperiodic acid | 8.0 | 1.0E−01 | 1.0E−02 | 1.0E−02 | 1.0E−02 | | N/A | Balance |
| Example 75 | Orthoperiodic acid | 8.0 | 1.0E−02 | 1.0E−03 | 1.0E−03 | 1.0E−03 | | N/A | Balance |
| Example 76 | Orthoperiodic acid | 8.0 | 1.0E−03 | 1.0E−04 | 1.0E−04 | 1.0E−04 | | N/A | Balance |
| Example 77 | Orthoperiodic acid | 8.0 | 1.0E−04 | 1.0E−05 | 1.0E−05 | 1.0E−05 | | N/A | Balance |
| Example 78 | Orthoperiodic acid | 8.0 | 5.0E−04 | 5.0E−05 | 5.0E−05 | 5.0E−05 | | N/A | Balance |
| Example 79 | Orthoperiodic acid | 8.0 | 5.0E−06 | 5.0E−07 | 5.0E−07 | 5.0E−07 | | N/A | Balance |

TABLE 1-continued

| | | | | | | | | | |
|---|---|---|---|---|---|---|---|---|---|
| Example 80 | Orthoperiodic acid | 8.0 | 1.0E−04 | 1.0E−04 | 1.0E−04 | 1.0E−04 | | N/A | Balance |
| Example 81 | Orthoperiodic acid | 8.0 | 1.0E−02 | 1.0E−05 | 1.0E−05 | 1.0E−05 | | N/A | Balance |
| Example 82 | Orthoperiodic acid | 8.0 | 1.0E+00 | 5.0E−07 | 5.0E−07 | 5.0E−07 | | N/A | Balance |
| Example 83 | Orthoperiodic acid | 8.0 | 1.0E+00 | 1.0E−08 | 1.0E−08 | 1.0E−08 | | N/A | Balance |
| Example 84 | Orthoperiodic acid | 8.0 | 1.0E−04 | | | | 1.0E−03 | N/A | Balance |
| Example 85 | Orthoperiodic acid | 8.0 | 1.0E−04 | | | | 1.0E−04 | N/A | Balance |
| Example 86 | Orthoperiodic acid | 8.0 | 1.0E−04 | | | | 1.0E−07 | N/A | Balance |
| Example 87 | Orthoperiodic acid | 8.0 | 1.0E−04 | | | | 5.0E−09 | N/A | Balance |
| Example 88 | Orthoperiodic acid | 8.0 | 1.0E−04 | | | | | TMAH | Balance |
| Example 89 | Orthoperiodic acid | 8.0 | 1.0E−04 | | | | | TEAH | Balance |
| Example 90 | Orthoperiodic acid | 8.0 | 1.0E−04 | | | | | TBAH | Balance |

| | pH of chemical solution | Halogen oxoacids/ Specific anion | $SO_4^{2-}/NO_3^-$ | $SO_4^{2-}/PO_4^{3-}$ | $SO_4^{2-}/BO_3^{3-}$ | Specific anion/Mn | Storage stability | Defect inhibition properties |
|---|---|---|---|---|---|---|---|---|
| Example 61 | 1.0 | 1.3E+06 | 1.0E+01 | 1.0E+01 | | | A | C |
| Example 62 | 1.0 | 8.0E+02 | 1.0E+03 | 1.0E+03 | | | B | B |
| Example 63 | 1.0 | 8.0E+00 | 2.0E+06 | 2.0E+06 | | | D | A |
| Example 64 | 1.0 | 6.7E+00 | 1.0E+01 | | 1.0E+01 | | D | A |
| Example 65 | 1.0 | 6.7E+01 | 1.0E+01 | | 1.0E+01 | | C | B |
| Example 66 | 1.0 | 6.7E+02 | 1.0E+01 | | 1.0E+01 | | B | B |
| Example 67 | 1.0 | 6.7E+03 | 1.0E+01 | | 1.0E+01 | | B | C |
| Example 68 | 1.0 | 6.7E+04 | 1.0E+01 | | 1.0E+01 | | B | C |
| Example 69 | 1.0 | 1.3E+04 | 1.0E+01 | | 1.0E+01 | | B | C |
| Example 70 | 1.0 | 1.3E+06 | 1.0E+01 | | 1.0E+01 | | A | C |
| Example 71 | 1.0 | 8.0E+02 | 1.0E+03 | 1.0E+03 | 1.0E+03 | | B | B |
| Example 72 | 1.0 | 8.0E+00 | 2.0E+06 | 2.0E+06 | 2.0E+06 | | D | A |
| Example 73 | 1.0 | 6.2E+00 | 1.0E+01 | 1.0E+01 | 1.0E+01 | | D | A |
| Example 74 | 1.0 | 6.2E+01 | 1.0E+01 | 1.0E+01 | 1.0E+01 | | C | A |
| Example 75 | 1.0 | 6.2E+02 | 1.0E+01 | 1.0E+01 | 1.0E+01 | | B | A |
| Example 76 | 1.0 | 6.2E+03 | 1.0E+01 | 1.0E+01 | 1.0E+01 | | B | B |
| Example 77 | 1.0 | 6.2E+04 | 1.0E+01 | 1.0E+01 | 1.0E+01 | | B | B |
| Example 78 | 1.0 | 1.2E+04 | 1.0E+01 | 1.0E+01 | 1.0E+01 | | B | B |
| Example 79 | 1.0 | 1.2E+06 | 1.0E+01 | 1.0E+01 | 1.0E+01 | | A | B |
| Example 80 | 1.0 | 2.0E+04 | 1.0E+00 | 1.0E+00 | 1.0E+00 | | C | B |
| Example 81 | 1.0 | 8.0E+02 | 1.0E+03 | 1.0E+03 | 1.0E+03 | | B | A |
| Example 82 | 1.0 | 8.0E+00 | 2.0E+06 | 2.0E+06 | 2.0E+06 | | D | A |
| Example 83 | 1.0 | 8.0E+00 | 1.0E+08 | 1.0E+08 | 1.0E+08 | | D | B |
| Example 84 | 1.0 | 8.0E+04 | | | | 1.0E−01 | A+ | E |
| Example 85 | 1.0 | 8.0E+04 | | | | 1.0E+00 | A+ | E |
| Example 86 | 1.0 | 8.0E+04 | | | | 1.0E+03 | A+ | D |
| Example 87 | 1.0 | 8.0E+04 | | | | 2.0E+04 | A | D |
| Example 88 | 4.5 | 8.0E+04 | | | | | B | D |
| Example 89 | 4.5 | 8.0E+04 | | | | | B | D |
| Example 90 | 4.5 | 8.0E+04 | | | | | B | D |

TABLE 1

| | Composition of chemical solution | | | | | | | |
|---|---|---|---|---|---|---|---|---|
| | Halogen oxoacids | Specific anion | | | | Mn | | |
| | | $SO_4^{2-}$ | $NO_3^-$ | $PO_4^{3-}$ | $BO_3^{3-}$ | | | |
| | Type | Content % By mass | Content % By mass | Content % By mass | Content % By mass | Content % By mass | pH adjuster Type | Water Content |
| Example 91 | Orthoperiodic acid | 8.0 | 1.0E−04 | | | | | Aqueous ammonia | Balance |
| Example 92 | Orthoperiodic acid | 8.0 | 1.0E−04 | | | | | DGA | Balance |
| Example 93 | Orthoperiodic acid | 8.0 | 1.0E−04 | | | | | Acetic acid | Balance |

TABLE 1-continued

| | | | | | | | | |
|---|---|---|---|---|---|---|---|---|
| Example 94 | Orthoperiodic acid | 8.0 | 1.0E−04 | | | | Hydrochloric acid | Balance |
| Example 95 | Orthoperiodic acid | 8.0 | 1.0E−04 | | | | Hydrofluoric acid | Balance |
| Example 96 | Metaperiodic acid | 8.0 | 1.0E−04 | | | | N/A | Balance |
| Example 97 | Perbromic acid | 8.0 | 1.0E−04 | | | | N/A | Balance |
| Example 98 | Bromic acid | 8.0 | 1.0E−04 | | | | N/A | Balance |
| Example 99 | Bromous acid | 8.0 | 1.0E−04 | | | | N/A | Balance |
| Example 100 | Hypobromous acid | 8.0 | 1.0E−04 | | | | N/A | Balance |
| Example 101 | Perchloric acid | 8.0 | 1.0E−04 | | | | N/A | Balance |
| Example 102 | Chloric acid | 8.0 | 1.0E−04 | | | | N/A | Balance |
| Example 103 | Chlorous acid | 8.0 | 1.0E−04 | | | | N/A | Balance |
| Example 104 | Hypochlorous acid | 8.0 | 1.0E−04 | | | | N/A | Balance |
| Example 105 | Hypofluorous acid | 8.0 | 1.0E−04 | | | | N/A | Balance |
| Comparative Example 1 | Orthoperiodic acid | 8.0 | | | | | N/A | Balance |
| Comparative Example 2 | N/A | | 1.0E−04 | | | | N/A | Balance |
| Comparative Example 3 | N/A | | 1.0E−04 | 1.0E−04 | 1.0E−04 | 1.0E−04 | N/A | Balance |
| Comparative Example 4 | Orthoperiodic acid | 8.0 | 2.0E+00 | | | | N/A | Balance |
| Comparative Example 5 | Orthoperiodic acid | 8.0 | 2.0E+00 | 2.0E+00 | 2.0E+00 | 2.0E+00 | N/A | Balance |
| Comparative Example 6 | Orthoperiodic acid | 8.0 | 1.0E−08 | | | | N/A | Balance |
| Comparative Example 7 | Orthoperiodic acid | 8.0 | 2.0E+00 | 1.0E−08 | | | N/A | Balance |
| Comparative Example 8 | Orthoperiodic acid | 8.0 | 2.0E+00 | 1.0E−08 | 1.0E−08 | | N/A | Balance |
| Comparative Example 9 | Orthoperiodic acid | 8.0 | 2.0E+00 | 1.0E−08 | | 1.0E−08 | N/A | Balance |
| Comparative Example 10 | Orthoperiodic acid | 8.0 | 2.0E+00 | 1.0E−08 | 1.0E−08 | 1.0E−08 | N/A | Balance |

| | pH of chemical solution | Halogen oxoacids/ Specific anion | $SO_4^{2-}/NO^{3-}$ | $SO_4^{2-}/PO_4^{3-}$ | $SO_4^{2-}/BO_3^{3-}$ | Specific anion/Mn | Storage stability | Defect inhibition properties |
|---|---|---|---|---|---|---|---|---|
| Example 91 | 4.5 | 8.0E+04 | | | | | B | D |
| Example 92 | 4.5 | 8.0E+04 | | | | | B | D |
| Example 93 | 0.0 | 8.0E+04 | | | | | B | D |
| Example 94 | 0.0 | 8.0E+04 | | | | | B | D |
| Example 95 | 0.0 | 8.0E+04 | | | | | B | D |
| Example 96 | 1.0 | 8.0E+04 | | | | | B | D |
| Example 97 | 1.0 | 8.0E+04 | | | | | B | D |
| Example 98 | 1.0 | 8.0E+04 | | | | | B | D |
| Example 99 | 1.0 | 8.0E+04 | | | | | B | D |
| Example 100 | 1.0 | 8.0E+04 | | | | | B | D |
| Example 101 | 1.0 | 8.0E+04 | | | | | B | D |
| Example 102 | 1.0 | 8.0E+04 | | | | | B | D |
| Example 103 | 1.0 | 8.0E+04 | | | | | B | D |
| Example 104 | 1.0 | 8.0E+04 | | | | | B | D |
| Example 105 | 1.0 | 8.0E+04 | | | | | B | D |
| Comparative Example 1 | 1.0 | | | | | | A | F |
| Comparative Example 2 | 1.8 | 0.0E+00 | | | | | E | C |
| Comparative Example 3 | 1.8 | 0.0E+00 | 1.0E+00 | 1.0E+00 | 1.0E+00 | | E | B |
| Comparative Example 4 | 0.8 | 4.0E+00 | | | | | E | A |
| Comparative Example 5 | 0.8 | 1.0E+00 | 1.0E+00 | 1.0E+00 | 1.0E+00 | | E | A |
| Comparative Example 6 | 1.0 | 8.0E+08 | | | | | A+ | F |
| Comparative Example 7 | 0.8 | 4.0E+00 | 2.0E+08 | | | | E | A |

TABLE 1-continued

| | | | | | | | |
|---|---|---|---|---|---|---|---|
| Comparative Example 8 | 0.8 | 4.0E+00 | 2.0E+08 | 2.0E+08 | | E | A |
| Comparative Example 9 | 0.8 | 4.0E+00 | 2.0E+08 | | 2.0E+08 | E | A |
| Comparative Example 10 | 0.8 | 4.0E+00 | 2.0E+08 | 2.0E+08 | 2.0E+08 | E | A |

From the results shown in the table, it has been confirmed that the chemical solution according to the embodiment of the present invention has excellent storage stability and excellent defect inhibition properties.

Especially, it has been confirmed that in a case where the content of the specific anion is equal to or lower than 0.5% by mass (more preferably equal to or lower than 0.05% by mass) with respect to the total mass of the chemical solution, the storage stability of the chemical solution is further improved (comparison of Examples 2, 3, 7, and the like).

It has been confirmed that in a case where the content of the specific anion is equal to or higher than 1 ppm by mass (0.0001% by mass) with respect to the total mass of the chemical solution, the defect inhibition properties of the chemical solution are further improved (comparison of Examples 9, 11, and the like).

It has been confirmed that in a case where the chemical solution contains two or more kinds of specific anions at the predetermined content, the defect inhibition properties of the chemical solution are further improved (comparison of Examples 2, 3, 45, 46, and the like).

It has been confirmed that in a case where the chemical solution contains three or more kinds of specific anions at the predetermined content, the defect inhibition properties of the chemical solution are further improved (comparison of Examples 45, 47, 55, 57, and the like).

It has been confirmed that in a case where the chemical solution contains four kinds of specific anions at the predetermined content, the defect inhibition properties of the chemical solution are further improved (comparison of Examples 56 to 61, 74 to 79, and the like).

It has been confirmed that in a case where the mass ratio of the content of $SO_4^{2-}$ to the content of $NO_3^-$, the mass ratio of the content of $SO_4^{2-}$ to the content of $PO_4^{3-}$, and/or the mass ratio of the content of $SO_4^{2-}$ to the content of $BO_3^{3-}$ in the chemical solution are higher than $1\times10^0$, the storage stability of the chemical solution is further improved (comparison of Examples 76, 77, 80, and the like).

It has been confirmed that in a case where the content of Mn in the chemical solution is 1 ppt by mass to 100 ppm by mass (more preferably 1 to 100 ppb by mass) with respect to the total mass of the chemical solution, the storage stability of the chemical solution is further improved (comparison of Examples, 9, 84 to 87, and the like).

EXPLANATION OF REFERENCES

10a: wiring substrate not yet being subjected to recess etching treatment for wiring
10b: wiring substrate having undergone recess etching treatment for wiring
12: interlayer insulating film
14: barrier metal layer
16: transition metal-containing wiring
18: recess
20, 30: object to be treated
22: substrate
24: transition metal-containing film
26: outer edge
32: substrate
34: transition metal-containing film
36: etch stop layer
38: interlayer insulating film
40: metal hard mask
42: hole
44: inner wall
44a: cross-sectional wall
44b: bottom wall
46: dry etching residue

What is claimed is:

1. A chemical solution used for removing a transition metal-containing substance on a substrate, comprising:
   one or more kinds of halogen oxoacids selected from the group consisting of a fluorine oxoacid, hypochlorous acid, chlorous acid, chloric acid, a bromine oxoacid, an iodine oxoacid, and a salt thereof; and
   at least two kinds of specific anions selected from the group consisting of $SO_4^{2-}$, $NO_3^-$, $PO_4^{3-}$, and $BO_3^{3-}$,
   wherein the content of each of at least two kinds of the specific anions is 5 ppm by mass to 1% by mass with respect to the total mass of the chemical solution.

2. The chemical solution according to claim 1,
   wherein the specific anions contain $SO_4^{2-}$ and $NO_3^-$.

3. The chemical solution according to claim 2,
   wherein the mass ratio of the content of $SO_4^{2-}$ to the content of $NO_3^-$ in the chemical solution is higher than $1\times10^0$ and equal to or lower than $2\times10^6$.

4. The chemical solution according to claim 1, comprising:
   at least three kinds of the specific anions,
   wherein the content of each of at least three kinds of the specific anions is 5 ppm by mass to 1% by mass with respect to the total mass of the chemical solution.

5. The chemical solution according to claim 4,
   wherein the specific anions contain $SO_4^{2-}$, $NO_3^-$, and one kind of anion selected from the group consisting of $PO_4^{3-}$ and $BO_3^{3-}$.

6. The chemical solution according to claim 5, which satisfies at least one of the following requirement A or requirement B,
   requirement A: the specific anions contain $PO_4^{3-}$, and the mass ratio of the content of $SO_4^{2-}$ to the content of $PO_4^{3-}$ in the chemical solution is higher than $1\times10^0$ and equal to or lower than $2\times10^6$,
   requirement B: the specific anions contain $BO_3^{3-}$, and the mass ratio of the content of $SO_4^{2-}$ to the content of $BO_3^{3-}$ in the chemical solution is higher than $1\times10^0$ and equal to or lower than $2\times10^6$.

7. The chemical solution according to claim 1,
   wherein the halogen oxoacids contain at least one kind of periodic acids selected from the group consisting of orthoperiodic acid, a salt of orthoperiodic acid, metaperiodic acid, and a salt of metaperiodic acid.

8. The chemical solution according to claim 1, wherein the content of the halogen oxoacids is equal to or lower than 37.0% by mass with respect to the total mass of the chemical solution.

9. The chemical solution according to claim 1, wherein the content of the halogen oxoacids is 2.0% to 8.0% by mass with respect to the total mass of the chemical solution.

10. The chemical solution according to claim 1, wherein the transition metal-containing substance contains at least one kind of metal selected from the group consisting of Ru, Rh, Ti, Ta, Co, Cr, Hf, Os, Pt, Ni, Mn, Cu, Zr, Mo, La, W, and Ir.

11. The chemical solution according to claim 1, wherein the transition metal-containing substance contains a Ru-containing substance.

12. The chemical solution according to claim 1 that has a pH lower than 8.0.

13. The chemical solution according to claim 1 that has a pH of 2.5 to 5.0.

14. The chemical solution according to claim 1, wherein the halogen oxoacids are selected from the group consisting of a fluorine oxoacid, a bromine oxoacid, an iodine oxoacid, and a salt thereof.

15. A chemical solution used for removing a transition metal-containing substance on a substrate, comprising:
one or more kinds of halogen oxoacids selected from the group consisting of a fluorine oxoacid, hypochlorous acid, chlorous acid, chloric acid, a bromine oxoacid, an iodine oxoacid, and a salt thereof; and
$SO_4^{2-}$;
$NO_3^{-}$;
$PO_4^{3-}$; and
$BO_3^{3-}$,
wherein the content of each of these anions is 5 ppm by mass to 1% by mass with respect to the total mass of the chemical solution.

16. The chemical solution according to claim 15, which satisfies at least one of the following requirement A or requirement B,
requirement A: the specific anions contain $PO_4^{3-}$, and the mass ratio of the content of $SO_4^{2-}$ to the content of $PO_4^{3-}$ in the chemical solution is higher than $1 \times 10^0$ and equal to or lower than $2 \times 10^6$,
requirement B: the specific anions contain $BO_3^{3-}$, and the mass ratio of the content of $SO_4^{2-}$ to the content of $BO_3^{3-}$ in the chemical solution is higher than $1 \times 10^0$ and equal to or lower than $2 \times 10$.

17. A chemical solution used for removing a transition metal-containing substance on a substrate, comprising:
one or more kinds of halogen oxoacids selected from the group consisting of a fluorine oxoacid, hypochlorous acid, chlorous acid, chloric acid, a bromine oxoacid, an iodine oxoacid, and a salt thereof;
one or more kinds of specific anions selected from the group consisting of $SO_4^{2-}$, $NO_3^{-}$, $PO_4^{3-}$, and $BO_3^{3-}$, and
Mn,
wherein the content of Mn is 1 ppt by mass to 100 ppm by mass with respect to the total mass of the chemical solution.

18. The chemical solution according to claim 17, wherein the content of Mn is 1 to 100 ppb by mass with respect to the total mass of the chemical solution.

19. A chemical solution used for removing a transition metal-containing substance on a substrate, comprising:
one or more kinds of halogen oxoacids selected from the group consisting of a halogen oxoacid and a salt thereof; and
one or more kinds of specific anions selected from the group consisting of $SO_4^{2-}$, $NO_3^{-}$, and $BO_3^{3-}$,
wherein in a case where the chemical solution contains one kind of the specific anion, the content of one kind of the specific anion is 5 ppm by mass to 1% by mass with respect to the total mass of the chemical solution, and
in a case where the chemical solution contains two or more kinds of the specific anions, the content of each of two or more kinds of the specific anions is equal to or lower than 1% by mass with respect to the total mass of the chemical solution, and the content of at least one of two or more kinds of the specific anions is equal to or higher than 5 ppm by mass with respect to the total mass of the chemical solution.

20. A method for treating a substrate, comprising:
a step A of removing a transition metal-containing substance on a substrate by using the chemical solution according to claim 1.

21. The method for treating a substrate according to claim 20, wherein the transition metal-containing substance contains a Ru-containing substance.

22. The method for treating a substrate according to claim 20, wherein the step A is a step A1 of performing a recess etching treatment on transition metal-containing wiring disposed on a substrate by using the chemical solution, a step A2 of removing a transition metal-containing film at an outer edge of a substrate, on which the transition metal-containing film is disposed, by using the chemical solution, a step A3 of removing a transition metal-containing substance attached to a back surface of a substrate, on which a transition metal-containing film is disposed, by using the chemical solution, a step A4 of removing a transition metal-containing substance on a substrate, which has undergone dry etching, by using the chemical solution, or a step A5 of removing a transition metal-containing substance on a substrate, which has undergone a chemical mechanical polishing treatment, by using the chemical solution.

23. The method for treating a substrate according to claim 22 that has the step A1 as the step A, further comprising:
a step B of treating the substrate obtained by the step A1 by using a solution selected from the group consisting of a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, and a mixed solution of hydrochloric acid and aqueous hydrogen peroxide after the step A1.

24. The method for treating a substrate according to claim 23, wherein the step A1 and the step B are alternately repeated.

25. The method for treating a substrate according to claim 20, further comprising:
a step C of performing a rinsing treatment on the substrate obtained by the step A by using a rinsing solution after the step A.

26. The method for treating a substrate according to claim 25, wherein the rinsing solution is a solution selected from the group consisting of hydrofluoric acid, hydrochloric acid, aqueous hydrogen peroxide, a mixed solution of hydrofluoric acid and aqueous hydrogen peroxide, a mixed solution of sulfuric acid and aqueous hydrogen peroxide, a mixed solution of aqueous ammonia and aqueous hydrogen peroxide, a mixed solution of hydrochloric acid and aqueous hydrogen peroxide, aqueous carbon dioxide, aqueous ozone, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, and an aqueous orthoperiodic acid solution.

27. The method for treating a substrate according to claim 20, wherein a temperature of the chemical solution is 20° C. to 75° C.

\* \* \* \* \*